(12) United States Patent
Evans

(10) Patent No.: US 11,190,206 B2
(45) Date of Patent: Nov. 30, 2021

(54) COMPRESSION AND DECOMPRESSION OF TIME SERIES DATA

(71) Applicant: EUROPEAN SPACE AGENCY, Paris (FR)

(72) Inventor: Dave Evans, Darmstadt (DE)

(73) Assignee: EUROPEAN SPACE AGENCY, Paris (FR)

( * ) Notice: Subject to any disclaimer, the term of this patent is extended or adjusted under 35 U.S.C. 154(b) by 235 days.

(21) Appl. No.: 16/483,671

(22) PCT Filed: Feb. 7, 2017

(86) PCT No.: PCT/EP2017/052644
§ 371 (c)(1),
(2) Date: Aug. 5, 2019

(87) PCT Pub. No.: WO2018/145730
PCT Pub. Date: Aug. 16, 2018

(65) Prior Publication Data
US 2021/0281275 A1 Sep. 9, 2021

(51) Int. Cl.
*H03M 7/00* (2006.01)
*H03M 7/30* (2006.01)
(Continued)

(52) U.S. Cl.
CPC ....... *H03M 7/3066* (2013.01); *H03M 7/3002* (2013.01); *H03M 7/3059* (2013.01); *H04L 69/04* (2013.01)

(58) Field of Classification Search
CPC .......................... H03M 7/3066; H03M 7/3002
(Continued)

(56) References Cited

U.S. PATENT DOCUMENTS 10,958,286 B2 * 3/2021 Evans ................... H03M 7/30
2020/0250186 A1 * 8/2020 Adams .............. G06F 16/24568

FOREIGN PATENT DOCUMENTS

| CA | 2472908 A1 | 1/2005 |
| WO | 2005/015881 A2 | 2/2005 |
| WO | 2013/029646 A1 | 3/2013 |

OTHER PUBLICATIONS

International Search Report and Written Opinion for related International Application No. PCT/EP2017/052644, dated Aug. 16, 2017; 15 pages.

* cited by examiner

*Primary Examiner* — Peguy Jean Pierre
(74) *Attorney, Agent, or Firm* — Procopio, Cory, Hargreaves & Savitch LLP

(57) ABSTRACT

The method involves sequentially encoding the plurality of data packets, which involves, for a data packet, obtaining a reference data packet, obtaining a mask packet indicative of which of the bits in the data packet are predictable and which of the bits in the data packet are not predictable obtaining change history data indicative of previously changed bits of the mask packet, determining an updated mask packet based on the mask packet, the data packet, and the reference data packet, determining updated change history data based on the change history data, the mask packet, and the updated mask packet, determining, as unpredictable bits, all those bits of the data packet that are indicated as not predictable by the updated mask packet, and generating an encoded data packet including a representation of the updated change history data and a representation of values of the unpredictable bits of the data packet.

16 Claims, 14 Drawing Sheets

(51) Int. Cl.
*H03M 7/32* (2006.01)
*H04L 29/06* (2006.01)

(58) Field of Classification Search
USPC .............................................. 341/50, 51, 60
See application file for complete search history.

570

| | |
|---|---|
| 25 | |
| 60 | |

300

| Type ID (310) | Age ID (320) | Bit Position (330) |
|---|---|---|
| 01 | 1 | 10 |
| 00 | 3 | 20 |
| 00 | 3 | 25 |

| Type ID (310) | Age ID (320) | Bit Position (330) |
|---|---|---|
| 01 | 1 | 10 |
| 00 | 3 | 20 |
| 01 | 0 | 25 |
| 01 | 0 | 60 |

Fig. 7B

| Type of Update | Type ID | Overwrite Existing Entries |
|---|---|---|
| Negative | 01 | Yes |
| Positive | 00 | N/A |
| Anchor | 10 | No |

COMPRESSION AND DECOMPRESSION OF TIME SERIES DATA

CROSS-REFERENCE TO RELATED APPLICATIONS

This application is a U.S. National Stage entry of PCT Application No: PCT/EP2017/052644 filed Feb. 7, 2017, the contents of which are incorporated herein by reference.

TECHNICAL FIELD

This application relates to methods and apparatus for encoding (e.g., compressing) and decoding (e.g., decompressing) time series data. The application particularly relates to compressing and decompressing telemetry (e.g., housekeeping telemetry) data packets (e.g., for spacecraft or systems aboard spacecraft) that does not require a-priori knowledge of the monitored system.

BACKGROUND

There is a widely held belief that compressing housekeeping data (as an example of time series data) obtained in monitoring a system (e.g., a spacecraft, such as a satellite, or a system aboard a spacecraft) will complicate the command and control link, use too much (on-board) processing power and increase mission risk. This complication and risk are perceived as outweighing the potential bandwidth saving. This argument is flawed. Implementing housekeeping telemetry compression has much more important benefits than simple bandwidth saving. It can be used to dramatically increase the information content in housekeeping telemetry (this is especially important in case of occurrence of a failure), it can be used to dramatically improve the speed of interaction with the monitored system (e.g., spacecraft or aboard a spacecraft), providing faster feedback and speeding up operations such as memory dumps and spacecraft testing pre-launch, it makes the whole process of telemetry selection much simpler and safer (reducing design and testing effort) and it can be used to drastically improve the robustness of the telemetry link.

The idea behind increasing information content is to maintain the same level of bandwidth usage for housekeeping but to use compression to sample more parameters at higher frequencies or perform other tasks such as memory dumping faster. Parameters that compress well can be included in housekeeping data packets with an almost negligible impact on bandwidth usage. Without compression it is necessary to carefully select all the parameters and their respective sampling rate in the housekeeping data packets. Thus, the aim is to arrive at a balanced compromise between bandwidth use and information content. Compression fundamentally changes this trade by effectively removing all "compressible" parameters. Hence one can simply select as many of these parameters at whatever sampling rate one wants in the housekeeping, with little bandwidth usage impact. There is no need to guess if these parameter histories might be needed one day and no need to design asynchronous triggers and events for these parameters.

This results in richer, finer information on the ground for purposes of analysis. Therefore it removes the need to guess or extrapolate when trying to reconstruct on-board events. It reduces the chance of missing important information due to low sampling rates (e.g., short abnormal behavior like spikes, transients, high frequency switching). Increased information content also gives the ground (in general, the monitoring side) more chance of discovering correlations between parameter behavior and important events or trends that simply is not possible using lower sampling rates (e.g., snapshots). These are all operationally important advantages.

However, compression of (spacecraft) housekeeping telemetry data poses a number of problems. Spacecraft housekeeping telemetry data typically contains significant amounts of information redundancy but it has proved difficult to remove the redundancy using simple algorithms. The main problem is data mixing occurring in generation and storage processes. Packets contain parameters each of which has a fixed length and data type. However each packet contains a mix of different parameters which means the lengths and types of data vary as the packet is read. To make matters worse different packet types can be stored into memory areas, called packet stores, in time generation order. This causes even more mixing of lengths and data types as each packet store is read. This data mixing is so disruptive for normal compression algorithms that some expand packet stores rather than compress them. Another major problem is that most compression methods only work on the stored data, whereas housekeeping data is often transmitted in real-time. Finally, real-time compression of housekeeping telemetry data may also require modifications in the critical command and control chain, which might be judged as too risky.

One algorithm to compress fixed length housekeeping data packets was developed by ESA and is described in WO 2013/029646 A1, which is herewith incorporated by reference in its entirety. This algorithm, which is commonly referred to as "POCKET" is fast enough for it to be implemented at packet generation time, i.e., it could be used on data packets that were stored for later downlink as well as on data packets that are transmitted in real-time. The algorithm does not change the packet handling processes in any way. A stream of fixed length packets enters the compression software block and a stream of identical data packets (expect they are much smaller and of variable length) leaves the block. The reverse is true in the decompression software block. The handling of those data packets on-board, through transport, and on ground is the same, e.g., they can be stored and sent later or sent in real-time etc. Before the control system, another software block takes the small variable length data packet stream as input and outputs the original large fixed length data packets, so that no changes to the control system are required. Alternatively, a process to handle the compressed packets within the control system can be implemented easily as there is no difference between a packet having been compressed with POCKET and a normal CCSDS (Consultative Committee for Space Data Systems) packet. POCKET was tested across a variety of mission types using historical data and it showed a good performance and stability, achieving between a factor of 3 up to a factor of 20 in average compression for different missions in terms of pure compression performance.

The general concept of POCKET is the following. A mask packet is used to split the bits in a data packet into those bits whose state we think we can predict and those bits we know we cannot predict. Non predictable bits are read as they are but predictable bits are XORed with the corresponding bits in a reference data packet. The reference data packet effectively holds the state prediction. The results of the XOR are run-length encoded (RLE) and send to the ground as a series of counters. Each run-length count correlates to a bit that was not in the predicted state, called wrong counters. Bit stuffing is performed to ensure that an integer number of bytes is reached and optionally a CRC is calculated from the original data packet so that the ground can be sure that the contents of the data packet have not been altered in the compression/decompression process. There are two modes, called chain and reference. In chain mode the reference data packet used is the previous data packet, in reference mode the reference data packet is a data packet that was uploaded by the ground beforehand.

Since a single process can be used for the real-time data flow as well as for stored data the benefits of this data compression algorithm can be used for those fields of application that rely on almost exclusive real-time telemetry flows for their command and control. One such field of application is telecommunication satellite control. Simulations have shown that POCKET can achieve good compression performance at in most cases negligible CPU usage. For example, simulations have shown that when using telecom satellite data, an increase in telemetry throughput by a factor of 8 or an increase in sampling rate by the same amount can be achieved by POCKET. Simulations have further confirmed that operating POCKET in chain mode is superior to reference mode in terms of compression performance.

However, POCKET has the following shortcomings.

Firstly, POCKET is not robust enough to use chain mode. This mode provides the best compression performance because bits change state more often than they change their rate of change. It is also the most stable mode. For example, when a spacecraft enters safe mode many bits change state but most do not change their rate of change. However if chain mode is used then a single packet loss will break the chain and all subsequent data packets cannot be decompressed. The state of the art procedure hence is to operate POCKET in reference mode, at somewhat inferior compression performance.

Secondly, POCKET requires a rather accurate estimation of bits that are predictable and bits that are not predictable. Compression does not work well in case of a significant number of bits of the data packet being wrongly classified. In particular, for bits that are wrongly classified as predictable, a so-called wrong counter needs to be produced, at the cost of compression performance (the data packet may expand rather than compress in some cases) and CPU usage. The impact of this shortcoming is especially severe when operating POCKET in reference mode after a spacecraft mode change.

Thirdly, POCKET includes ground software that requires access to historical telemetry. This is used to calculate reference data packets on the ground which are then loaded to the spacecraft. This results in additional overhead and storage requirements.

Fourthly, the POCKET decompression algorithm needs to know the configuration of the compression algorithm in order to work. Therefore the system needs to ensure that the compression module (e.g., on-board compression module) is synchronized with the decompression module (e.g., on the ground), which requires synchronous commanding of the two modules. This introduces system level complexity and reduces system robustness. It also means that the compression module cannot unilaterally and autonomously change its compression configuration.

Thus, there is a need for a robust and efficient method for encoding (e.g., compressing) and decoding (e.g., decompressing) time series data, such as telemetry data (e.g., telemetry housekeeping data). There is a further need for such method that can be reliably operated in chain mode. There is a yet further need for such method that does not require a-priori knowledge of the monitored system.

SUMMARY

In view of this need, the present document proposes a method of encoding (e.g., compressing) time series data, a method of decoding (e.g., decompressing) time series data, and corresponding apparatus and computer-readable media, having the features of the respective independent claims.

An aspect of the disclosure relates to a method of encoding (e.g., compressing) time series data (e.g., for transmission or storage). The method may comprise receiving a plurality of data packets of time series data. The method may further comprise sequentially encoding (e.g., compressing) the plurality of data packets. Sequentially encoding the plurality of data packets may comprise, for a data packet among the plurality of data packets (e.g., for each data packet), obtaining a reference data packet for the data packet. The sequential encoding may further comprise obtaining a mask packet indicative of which of the bits (e.g., bit positions) in the data packet are predictable and which of the bits (e.g., bit positions) in the data packet are not predictable. The mask packet may be a bit mask of the same length as each of the plurality of data packets of time series data. Predictable bits may be bits that are expected to be identical to corresponding bits in the reference data packet. Unpredictable bits may be bits that are not expected to be identical to corresponding bits in the reference data packet. The mask packet may have bits set to a first bit value (e.g., '1') for positions of bits that are not expected to be identical to corresponding bits (e.g., bits at corresponding bit positions) in the reference data packet, and set to a second bit value (e.g., '0') for positions of bits that are expected to be identical to corresponding bits in the reference data packet. However, depending on circumstances, also the converse assignment of bit values '0' and '1' may be chosen. Values of bits that are indicated as expected to be identical to corresponding bits in the reference data packet may not be encoded in the encoded data packet for the current data packet. Bits that are indicated as not expected to be identical to corresponding bits in the reference data packet may or may not be identical to respective bits in the reference data packet. The sequential encoding may further comprise obtaining change history data (e.g., mask evolution data) indicative of previously changed bits (e.g., updated bits) of the mask packet. The change history data may be indicative of previously changed bits (previous change, previously updated bit) of the mask packet since the processing of a data packet that precedes the current data packet by a predetermined number of data packets. The sequential encoding may further comprise determining an updated mask packet based on the mask packet, the data packet, and the reference data packet. The sequential encoding may further comprise determining updated change history data based on the change history data, the mask packet, and the updated mask packet. Determining the updated change history data may comprise adding an indication of changed bits between the mask packet and the updated mask packet to the change history data. For example, an indication of the change of the mask packet that has led to the updated mask packet may be added to the change history data. The sequential encoding may further comprise determining, as unpredictable bits, all those bits of the data packet that are indicated as not predictable by the updated mask packet. The sequential encoding may yet further comprise generating an encoded data packet including a representation of the updated change history data and a representation of values of the unpredictable bits of the data packet. The sequential encoding may further comprise, for the data packet, outputting the encoded data packet, for example for transmission or storage.

Configured as such, the proposed method is very robust with regard to packet loss and can reliably operate in chain mode, which allows to achieve very high compression efficiency. Although operated in chain mode, loss of a data packet does not result in the receiving side's inability to decode any subsequent data packets. Rather, due to the manner in which the mask packet is updated from cycle to cycle, any previous data packet (up to a configurable distance in time), not just the preceding data packet can be used as a reference data packet for subsequent data packets. Thus, the proposed method is robust even with regard to loss of multiple subsequent data packets. Further, having available the change history data allows to reconstruct the mask packet to be used for a current data packet even if one or more (up to the protection level) preceding data packets have been lost.

Further, as soon as a data packet and a mask packet are validly reconstructed (for example, from so-called anchor information that may be transmitted either periodically or on request or on trigger), using the change history data allows to decompress data packets, starting from the packet containing anchor information, both forward and backwards in time. Thus, data packets that could not be reconstructed upon receipt can be reconstructed later, once a packet containing anchor information is received and decompressed.

Further, the proposed method immediately reacts to negative changes in individual bits and a wrong prediction for a bit previously flagged as predictable bit will result in that bit being masked (i.e., indicated as not predictable) for the future. It will only be classed as predictable again once such behavior is confirmed. This feature allows the proposed method to deal more effectively with more diverse types of data, such as data where the bits exhibit both stable and unstable behavior over short timescales. Effectively, the proposed method constantly tracks the data redundancy in the data packets at bit level and reacts conservatively, making it safe to use in any situation. Thereby, compression efficiency can be further improved, since generation and transmission of so-called wrong counters is avoided.

Since the proposed method operates in chain mode and uses a dynamically updated mask packet, processing at the receiving side (decompression side) can be made very simple. In particular, mask packets and reference data packets no longer need to be calculated on ground. Moreover, there is no need for ensuring external synchronization of the transmitting side (compression side), such as an on-board compression module, and the receiving side, such as a decompression module on the ground. This implies that compression (i.e., compression algorithm) can act completely independently of decompression (i.e., decompression algorithm), so that details of compression can be adjusted without having to worry about changing the configuration of the decompression algorithm on the ground. It also implies that the decompression algorithm does not require set-up or configuration—it knows how to decompress any compressed packet without any a-priori information. This is much safer, robust and has a lower impact on operations.

Yet further, compared to the prior art approach, system complexity and overhead are reduced.

In embodiments, determining the updated mask packet may comprise comparing the data packet to the reference data packet. Comparing the data packet to the reference data packet may comprise obtaining an XOR (e.g., bit-wise XOR) of the data packet and the reference data packet. The resulting XOR may be referred to as an intermediate data packet.

In embodiments, determining the updated mask packet may further comprise configuring the updated mask packet to indicate all those bits as not predictable that are indicated as not predictable in the mask packet, or that are different between the data packet and the reference data packet. This may comprise determining, as mismatched bits, all those bits (e.g., bit positions) of the data packet that are indicated as predictable by the mask packet but that are not identical to bits at corresponding bit positions in the reference data packet, and updating the mask packet to indicate bits at the positions of the mismatched bits as bits that are not predictable (in addition to any bits previously indicated as not predictable), thereby obtaining the updated mask packet. That is, the updated mask packet may be obtained by an OR of the mask packet and the intermediate data packet.

Thus, the updating of the mask packet, as well as the determination of bits that are predictable and bits that are not predictable relies entirely on bitwise operations. These are fast, simple actions directly supported by the processor, so that the processes in question run extremely quickly. For example, the processes of the proposed method are in fact fast enough for them to be injected into a typical real-time spacecraft housekeeping telemetry stream without noticeable time delays.

In embodiments, determining the updated change history data may comprise comparing the updated mask packet to the mask packet. Comparing the updated mask packet to the mask packet may comprise obtaining an XOR of the updated mask packet and the mask packet. Said determining the updated change history data may further comprise adding an indication of changed bits between the updated mask packet and the mask packet to the change history data. Determining the indication of the changed bits between the updated mask packet and the mask packet may comprise run-length encoding the XOR of the updated mask packet and the mask packet. The change history data may include, for each indication of a changed bit, an indication of a bit position (e.g., count) of the changed bit within the mask packet, and an indication of the change type of the change (e.g., first type (positive change)—from indicating a bit that is not predictable to indicating a bit that is predictable (from first bit value to second bit value), or second type (negative change)—from indicating a bit that is predictable to indicating a bit that is not predictable (from second bit value to first bit value)).

In embodiments, the change history data may comprise one of more indications of changed bits between a respective mask packet and a respective updated mask packet. Each indication of a changed bit may include an indication of a bit position of the changed bit within the respective mask packet, and an indication of a change type of the change. Each indication of a changed bit may further include an indication of an ordering (e.g., time ordering) of the one or more indications of changed bits in the change history data. This indication may correspond to an indication of a previous data packet for which this changed bit has been changed (e.g., an indication of how many cycles earlier the previous data packet has been encoded). The change history data may be said to correspond to an accumulation of changed bits. Later changes of given bits may supersede earlier changes of the same bits. Whether changes supersede each other may depend on respective change types.

Thereby, the change history data may be generated in a simple and efficient manner. Moreover, the change history data is compact, yet includes all necessary information for reconstructing mask packets both forward and backward in time from an available mask packet for a given data packet.

In embodiments, the mask packet that is obtained for the current data packet may be the updated mask packet of the data packet preceding the current data packet. Further, the reference data packet that is obtained for the current data packet may be the data packet preceding the current data packet (which would correspond to the chain mode), or a predetermined reference data packet. Yet further, the change history data that is obtained for the current data packet may be the updated change history data of the data packet preceding the current data packet.

In embodiments, the method may further comprise monitoring values of bits in a sequence of data packets among the plurality of data packets. If the value of the bit at a given bit position in the sequence of data packets does not change for a given number of sequential data packets, the given bit position may be judged to relate to a bit that is predictable, and otherwise the given bit position may be judged to relate to a bit that is not predictable. Thus, monitoring the values of the bits in the sequence of data packets may proceed by initializing a positive mask packet to indicate all bits as predictable, and for each data packet among the given number of sequential data packets, updating the positive mask packet to indicate bits (e.g., bit positions) as not predictable if these bits are not identical to corresponding bits in the reference data packet. After the given number of data packets have been sequentially encoded, the mask packet may be updated based on a result of the judgement. Further, the change history data may be updated based on the result of the judgement. Updating the mask packet based on a result of the judgement may comprise updating the mask packet to indicate, as bits that are predictable, all those bits at bit positions that have been judged as relating to bits that are predictable. For example, updating the mask packet based on a result of the judgment may comprise setting the mask packet to the positive mask packet. The mask packet may be set to the positive mask packet periodically, on request, or on trigger. After setting the mask packet to the positive mask packet, the positive mask packet may be initialized again to indicate all bits as predictable. The method may further comprise updating the change history data accordingly (e.g., by adding indications of bit changes of first type (positive changes) to the change history data).

Configured as such, the proposed method provides for a means to re-classify bits as predictable if they behave accordingly, i.e., do not change value for a predetermined number of cycles. Thereby, accumulation of bits that are indicated as not predictable in the mask packet can be avoided, thereby reducing the number of bits the values of which have to be explicitly included in the generated packet.

In embodiments, the method may further comprise, if the data packet is to be additionally encoded to include a self-sufficient representation of the updated mask packet, obtaining a horizontal XOR of the updated mask packet. The method may further comprise run-length encoding the horizontal XOR of the updated mask packet. The run-length-encoded horizontal XOR of the updated mask packet may be said to represent information (e.g., absolute mask information) that enables reconstruction of the updated mask packet from scratch (e.g., starting out from a mask packet that is initialized to all '0's. The method may further comprise determining second updated change history data based on the updated change history data and the run-length-encoded horizontal XOR of the updated mask packet. When updating the updated change history data to obtain the second updated change history data, bit changes corresponding to the horizontal XOR of the updated mask packet may be indicated to have a change type that is a third type (e.g., change type 'anchor') indicating that these bit changes relate to a self-sufficient representation of the updated mask packet. Bit changes of other change types in the updated change history data (e.g., first type (positive change), second type (negative change)) may not be superseded (e.g., overwritten) at this stage. The method may further comprise generating the encoded data packet to include a representation of the second updated change history data and the representation of values of the unpredictable bits of the data packet. The method may yet further comprise setting a bit flag in the encoded data packet to indicate that the encoded data packet includes the self-sufficient representation of the updated mask packet. Any bit changes that are of the third change type may be removed from the change history data before processing the next data packet.

Accordingly, the proposed method can provide a compressed self-sufficient representation of the mask packet to the receiving side. Thereby, reconstruction of data packets at the receiving side is enabled, both forward and backwards from the mask packet that can be reconstructed from the self-sufficient representation, even if a packet loss has occurred, or if the receiving side had been unable to reconstruct mask packets for any other reason.

In embodiments, the method may further comprise splitting the data packet (e.g., by pre-processing) into variable length data and fixed length data. The fixed length data may be processed in accordance with the aforementioned methods, and the variable length data may be concatenated with the result of this processing.

Another aspect of the disclosure relates to a method of decoding (e.g., decompressing) time series data, for decoding a plurality of encoded data packets of time series data into corresponding decoded data packets of time series data. Each encoded data packet may include a representation of change history data and a representation of values of unpredictable bits of the corresponding decoded data packet. The change history data may be indicative of previously changed bits of a mask packet (e.g., used for encoding the time series data). The mask packet may be indicative of which of the bits (e.g., bit positions) in the corresponding decoded data packet are predictable and which of the bits in the corresponding decoded data packet are not predictable. Predictable bits may be bits that are expected to be identical to corresponding bits in the reference data packet. Unpredictable bits may be bits that are not expected to be identical to corresponding bits in the reference data packet. The mask packet may have bits set to a first bit value (e.g., '1') for positions of bits that are not expected to be identical to corresponding bits (i.e., bits at corresponding bit positions) in the reference data packet, and set to a second bit value (e.g., '0') for positions of bits that are expected to be identical to corresponding bits in the reference data packet. However, depending on circumstances, also the converse assignment of bit values '0' and '1' may be chosen. Values of bits that are indicated as expected to be identical to corresponding bits in the reference data packet may not be encoded in the encoded data packet for the data packet. Bits that are indicated as not expected to be identical to corresponding bits in the reference data packet may or may not be identical to respective bits in the reference data packet. The method may comprise receiving the plurality of encoded data packets of time series data. The method may further comprise sequentially decoding (e.g., decompressing) the plurality of encoded data packets. Sequential decoding the plurality of encoded data packets may comprise, for an encoded data packet among the plurality of encoded data packets (e.g., for each encoded data packet), obtaining a reference data packet for the corresponding decoded data packet. The sequential decoding may further comprise obtaining the mask packet. The sequential decoding may further comprise extracting the change history data from the encoded data packet. The sequential decoding may further comprise extracting the values of the unpredictable bits of the corresponding decoded data packet from the encoded data packet. The sequential decoding may further comprise determining an updated mask packet based on the mask packet and the change history data. The sequential decoding my yet further comprise determining (e.g., generating) the corresponding decoded data packet based on the reference data packet, the updated mask packet, and the values of the unpredictable bits. The sequential decoding may further comprise, for the encoded data packet, outputting the corresponding decoded data packet.

In embodiments, the change history data extracted from the encoded data packet may comprise one of more indications of changed bits between a respective mask packet and a respective updated mask packet. Each indication of a changed bit may include an indication of a bit position of the changed bit within the respective mask packet, and an indication of a change type of the change. Each indication of a changed bit may further include an indication of an ordering (e.g., time ordering) of the one or more indications of changed bits in the change history data. This indication may correspond to an indication of a previous data packet for which this changed bit has been changed (e.g., an indication of how many cycles earlier the previous data packet has been encoded). The change history data may be said to correspond to an accumulation of changed bits. Later changes of given bits may supersede earlier changes of the same bits. Whether changes supersede each other may depend on respective change types.

In embodiments, determining the updated mask packet may comprise applying all changed bits indicated by the change history data to the mask packet.

In embodiments, the mask packet that is obtained for the encoded data packet may be based on (e.g., may be) an updated mask packet of an encoded data packet that has been decoded earlier. The encoded data packet that has been decoded earlier may precede the encoded data packet in the sequence of encoded data packet by up to the predetermined number of data packets. It may be the immediately preceding encoded data packet, if the mask packet is available for that encoded data packet. Further, the reference data packet that is obtained for the corresponding decoded data packet may be the corresponding decoded data packet decoded from an encoded data packet that has been decoded earlier, or a predetermined reference data packet, or an uncompressed packet. Any successfully decoded data packet or uncompressed packet sent since the next-to-last positive update of the mask packet can be used as the reference data packet. For example, the immediately preceding decoded data packet may be used, if available.

In embodiments, the method may further comprise, if the encoded data packet is flagged (e.g., by a bit flag) to include a self-sufficient representation of the updated mask packet. In this case the change history data indicates for each bit change a bit position of the changed bit and a change type, the change types including a first type (e.g., positive change) indicating a bit change of the respective bit from a first bit value that indicates the corresponding bit as not predictable to a second bit value that indicates the corresponding bit as predictable, a second type (e.g., negative change) indicating a bit change of the respective bit from the second bit value to the first bit value, and a third type (e.g., anchor) indicating that the respective bit change relates to the self-sufficient representation of the updated mask packet. The updated mask packet may be obtained by resetting the mask packet so that all bits of the mask packet have the second bit value. The updated mask packet may be further obtained by cycling through the bits of the mask packet and for each bit of the mask packet, if a bit change in the change history data at a bit position corresponding to the respective bit of the mask packet is of the first type, not changing the value of the respective bit. This may further comprise, while cycling through the bits of the mask packet, if a bit change in the change history data at a bit position corresponding to the respective bit of the mask packet is of the second type, changing the value of the respective bit to the first bit value. This may yet further comprise, while cycling through the bits of the mask packet, if a bit change in the change history data at a bit position corresponding to the respective bit of the mask packet is of the third type, setting the value of the respective bit to the inverse of the bit value of the preceding bit of the mask packet. The preceding bit for the first bit of the mask packet may be assumed to have the first bit value.

Another aspect of the disclosure relates to an apparatus comprising a processor and a memory coupled to the processor. The processor may be configure to perform the method of any one of the aforementioned aspects. The memory may store instructions that are executable by the processor.

Another aspect of the disclosure relates to a computer-readable storage medium containing instructions for execution by a processor that cause the processor to perform the steps of the methods of any one of the aforementioned aspects.

It will be appreciated that method steps and apparatus or system features may be interchanged in many ways. In particular, the details of the disclosed system can be implemented as a method, and vice versa, as the skilled person will appreciate.

BRIEF DESCRIPTION OF THE FIGURES

Example embodiments of the disclosure are explained below with reference to the accompanying drawings, wherein.

DETAILED DESCRIPTION

Figures 1, 3:
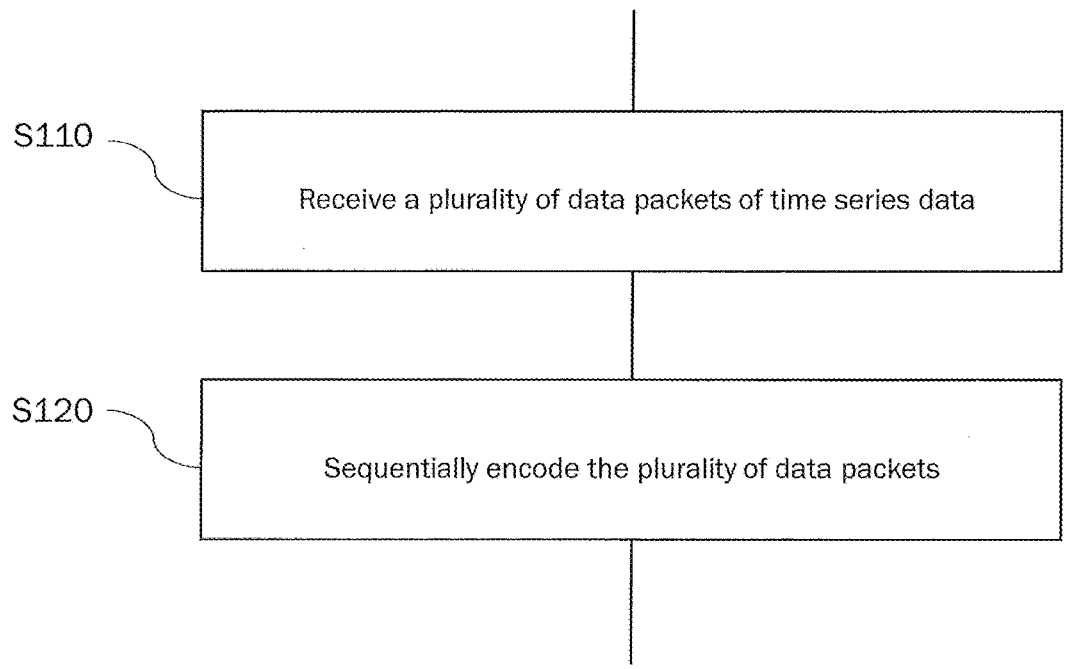
FIG. 1 is a flow chart schematically illustrating a method of encoding (e.g., compressing) time series data according to embodiments of the disclosure.

In the following, example embodiments will be described with reference to the appended figures. Identical elements in the figures may be indicated by identical reference numbers, and repeated description thereof may be omitted for reasons of conciseness.

Broadly speaking, the method according to the present disclosure uses a bit mask to split a packet into those bits which have the same value as a reference data packet and those that may not. The latter are called Non Predictable Bits (unpredictable bits) and are sent in the clear, the former are called Predictable Bits and can be derived from the mask information which is run-length encoded and sent as a series of counters.

The method introduces the idea of a constantly updating the mask. It updates negatively (by a negative update, bits previously indicated as predictable are now indicated as unpredictable) every cycle (i.e., for every data packet that is encoded) and may update positively (by a positive update, bits previously indicated as unpredictable are now indicated as predictable) periodically, or on request, or on trigger. The mask information is normally sent in delta form (e.g., for normal data packets) covering a configurable number of data packets (e.g., including differences up to the configurable number of data packets back in time), but can also be sent in absolute form (e.g., in the form of packets containing anchor information).

The reference data packet used by the encoding side (e.g., on-board) may always be the last generated data packet of that type. However, due to the nature of the update of the mask packet (i.e., since only negative updates are performed for each cycle), the decoding side (e.g., on the ground) can use, as a reference data packet, any data packet that has been generated since the last but one positive update of the mask packet had been performed.

According to the method, it is possible to send anchor information (a self-sufficient representation of the mask packet) in which case the ground can decompress the data packet without any present mask information. This "safety" information may be added periodically, or on request, or on trigger. It can also be used to start the compression sequence.

The method further introduces the idea of an array which records all the changes to the mask packet covering a configurable number of past data packets. This is called the Mask Evolution History Array, or Change History Data. The number of past deltas between sequential data packets in the array minus one is called the protection level and corresponds to the number of sequential data packets that can be lost without impacting the packet decompression process.

Before a compressed data packet is generated, the array is "issued", i.e., all the entries are coded into counters (or bit positions) with some extra information to distinguish the type of change associated with each count. This information is added to the unpredictable bit information and some flags and the packet is sent. The Mask Evolution History Array is then "cleaned up" before being ready to accept new updates again.

As indicated above, the Mask Evolution History Array can also be used to carry other information such as the absolute value of the mask (e.g., anchor information). This "safety" information is added periodically, or on request, or on trigger, as indicated above.

Thus, the Mask Evolution History Array can be updated by negative changes, positive changes, or anchor information. The input is provided in the form of single field arrays (negative array, positive array, anchor array). There is a separate process for generation of each of these arrays.

Decompression consists of reading the data packet starting from the header and recreating the Mask Evolution History Array. The entries are then used to update (or recreate) the ground mask, read the non-predictable bit part(s) of the packet and with the help of a reference data packet, recreate the original data packet. The information in the Mask Evolution History Array can also be used to decompress past data packets, correct some corrupted past data packets or retrieve some information in lost data packets.

In summary, the method according to the present disclosure changes the paradigm from linking consecutive data packets by their reference data packets (i.e., decompressing a data packet using the last packet information) or using fixed mask and reference data packet configurations, to linking data packets by their mask evolutions. This allows the data packets to be decompressed using a large selection of different data packets transmitted in the past. The mask packet is evolved in an adaptive and asymmetric manner, i.e., it reacts immediately in the case of a wrong prediction but only periodically in cases of good predictions. This makes it very reactive and suitable to use on different types of scenarios, e.g., safe mode entry. The method further allows the mask evolution history to be sent to the decoding side (e.g., ground) very efficiently. In fact, the mask evolution history can be sent so efficiently that single data packets can carry the mask evolution information from many data packets before them. This can be exploited to provide robustness in case multiple consecutive data packets are lost and to retrieve information in data packets that would otherwise have been lost forever. The method also allows to create compressed data packets (e.g., packets containing anchor information) that contain all the mask information coded into them providing an extra layer of robustness.

Methods according to embodiments of the disclosure exploit the fact that parameters that represent physical values do not normally change rapidly across their entire allocated dynamic range. For example, one may allocate eight bits for a temperature reading that can change between −200 and +200° C. However, between two consecutive readings (samples) the maximum change is only a few degrees. This implies that the majority of bits in a collection of such values will not change state over medium sized time periods. To exploit this property for compression, one may make the following "bet": Any bit that always had the same value in previous rounds and has not changed value in the present round will have that same value in the next data packet. Therein, a round is defined as fixed number of data packets.

The results of that bet are then run-length encoded and sent to the ground along with the raw values of any bits one did not bet on. This is the basis of the compression. Note that by definition the number of bits one bets on can increase every round and decrease every data packet. The trick is how to communicate which bet was made to the ground so it can interpret the results. This is done in the form of a bit mask evolution history which shows (among others) the two different types of changes, i.e., positive, we were not betting on this bit but will now, and negative, we were betting on that bit previously but will not anymore.

FIG. 1 is a flow chart schematically illustrating a method of encoding (e.g., compressing) time series data. The method receives a plurality (e.g., sequence) of data packets of time series data at step S110. The data packets all may have the same length in terms of bits. The time series data may relate to telemetry data (e.g., housekeeping telemetry data) and may indicate values of a plurality of parameters that indicate a state of a monitored system. The monitored system may be a spacecraft (e.g., satellite), or a system aboard a spacecraft. Then, at step S120, the plurality of data packets are sequentially encoded (e.g., compressed). Each data packet may be encoded during a respective cycle.

Figure 2:
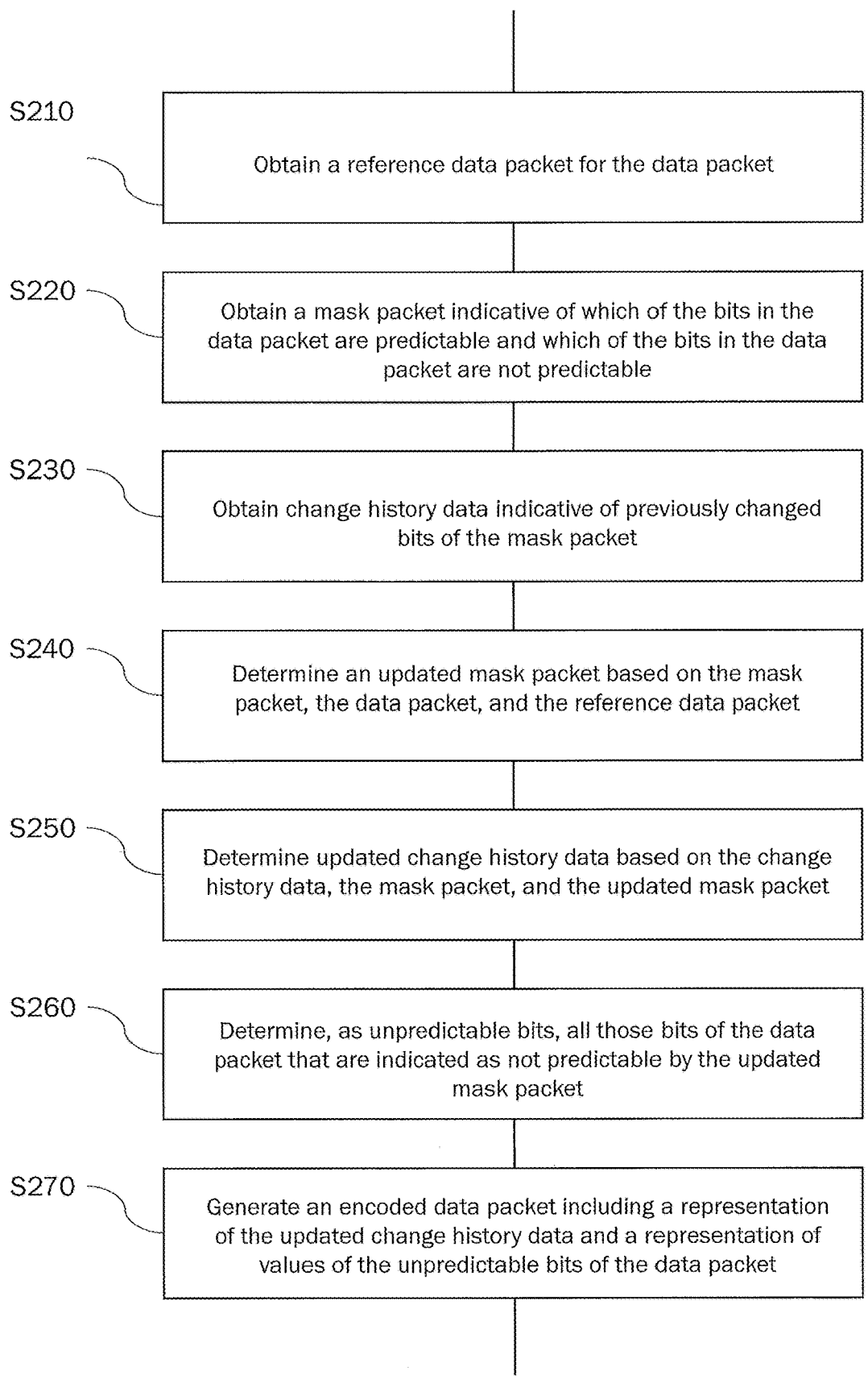
FIG. 2 is a flow chart schematically illustrating details of the method of FIG. 1, FIG. 3 schematically illustrates an example of change history data.

FIG. 2 is a flow chart schematically illustrating details of step S120 in FIG. 1. Steps S210 to S270 of FIG. 2 are performed for a data packet among the plurality of data packets. For example, the aforementioned steps may be performed for each data packet that is received at step S110 in FIG. 1.

At step S210, a reference data packet is obtained for the data packet. This data packet may also be referred to as the current data packet. The reference data packet preferably is the data packet preceding the current data packet. However the reference data packet to be used may also be a fixed reference data packet, as will be described in more detail below.

At step S220, a mask packet is obtained. The mask packet is indicative of which of the bits (e.g., bit positions) in the data packet are predictable and which of the bits (e.g., bit positions) in the data packet are not predictable. Bits that are indicated as predictable are expected to be identical to corresponding bits (i.e., bits at corresponding positions) in the reference data packet; bits at those positions had been identical between the previous data packet and the previous data packet's reference data packet. Bits that are indicated as not predictable are not expected to be identical to corresponding bits in the reference data packets; those bits may or may not be identical to corresponding bits in the reference data packet. Typically, the mask packet is a bit map having the same length (in terms of bits) as the data packet. It may have bits set to a first value (e.g., bit value '1') for bits that are not expected to be identical to corresponding bits in the reference data packet, and bits set to a second value (e.g., bit value '0') for bits that are expected to be identical to corresponding bits in the reference data packet. Depending on circumstances, also the reverse assignment of bit values '1' and '0' may be chosen. Typically, the mask packet that is obtained at step S220 is the mask packet at the end of encoding the preceding data packet.

At step S230, change history data (e.g., mask evolution history) is obtained. The change history data is indicative of previously changed bits (e.g., previous changes, previously updated bits) of the mask packet. The change history data may reach back up to a configurable number of data packets, which number is referred to as the protection level. Thus, the change history data includes all changes that need to be performed on a mask packet for a data packet that precedes the current data packet by the configurable number of data packets in order to arrive at the mask packet for the current data packet. Typically, the change history data that is obtained at step S230 is the change history data at the end of encoding the preceding data packet. The change history data is described in more detail with reference to FIG. 3.

At step S240, an updated mask packet is determined based on the mask packet, the current data packet, and the reference data packet. The updated mask packet is updated such that bits that are indicated as predictable by the updated mask packet are identical to corresponding bits in the reference data packet. In this sense, the notion of bits that are indicated as predictable could be replaced by bits that are indicated as identical to the corresponding bits in the reference data packet. Details of this step will be described below with reference to FIG. 4.

Thus, while the state of the art uses a static mask packet that is either loaded from the ground or periodically generated on-board, the method according to the present disclosure updates the mask packet every time a new data packet is generated (i.e., in each cycle). This mask evolution process is a core process also of decompression and has significant advantages as described later.

At step S250, updated change history data is determined based on the change history data, the mask packet, and the updated mask packet. Determining the updated change history data comprises adding an indication of changed bits between the mask packet and the updated mask packet to the change history data. For example, an indication of the changes of the mask packet that have led to the updated mask packet may be added to the change history data.

At step S260, all those bits of the data packet that are indicated as not predictable by the updated mask packet are determined as unpredictable bits. To this end, bits at bit positions indicated by the mask packet as relating to bits that are not predictable may be extracted in order from first to last bit of the data packet. This may yield an array of unpredictable bits. The number of unpredictable bits is identical to the number of bit positions in the updated mask packet that indicate corresponding bits in the data packet to be not predictable. For example, the updated mask packet may indicate bits that are not predictable by a bit value '1' in the updated mask packet. Then, cycling through the data packet and the updated mask packet, from first bit to last bit, all those bits of the data packet may be extracted for which the corresponding bit of the updated mask packet has bit value '1'.

At step S270, an encoded data packet including a representation of the updated change history data and a representation of values of the unpredictable bits of the data packet is generated. Values of bits that are indicated as expected to be identical to corresponding bits in the reference data packet are not encoded in the encoded data packet for the data packet, since they are derivable from the reference data packet, referring to the (updated) mask packet. The encoded data packet may be output, for example for transmission or storage.

Unless indicated otherwise, steps among the aforementioned group of steps or among groups of steps described in the remainder of this document that do not require each other as prerequisites may be performed in any order and may also be performed in parallel. For example, steps S210, S220, and S230 in FIG. 2 may be performed in any order or in parallel.

FIG. 3 schematically illustrates an example of change history data 300. The change history data may be arranged as an array of changes (e.g., bit changes, or changed bits). Each entry of this array may have three fields for the respective change: a type ID field 310, an age ID field 320, and a bit position field 330. Changes within the array may be ordered in ascending order on the bit position field 330. The bit position can take any value between zero and the data packet length (i.e., the number of bits in each of the data packets) minus one. The type ID field 310 for each entry can take values indicating a type of the respective change. The type ID may be a two-bit value and may take values indicating a positive change (e.g., value '00'), or a negative change (e.g., value '01'). Depending on whether anchor information is foreseen to be generated, the type ID field 310 can further take values indicating anchor information (e.g., value '10'). Further, each entry has an age ID which can take values from zero (most recent change) to a configurable maximum. The configurable maximum determines the number of previous data packets for which the mask evolution history is stored in the array. This configurable maximum may be referred to as the protection level. On each cycle, the values of the age ID for all entries of the array of changes may be incremented by one, discarding entries whose age ID exceeds the configurable maximum.

In general, the change history data may be said to correspond to an accumulation of changed bits. Accordingly, the change history data in general includes one of more indications of changed bits between a respective mask packet and a respective updated mask packet. Each indication of a changed bit includes an indication of a bit position of the changed bit within the respective mask packet (e.g., in bit position field 330), and an indication of a change type of the change (e.g., in type ID field 310). Each indication of a changed bit may further include an indication of an ordering (e.g., time ordering) of the one or more indications of changed bits in the change history data (e.g., in age ID field 320). This indication may correspond to an indication of a previous data packet for which this changed bit has been changed (e.g., an indication of how many cycles earlier the previous data packet has been encoded).

Figure 4:
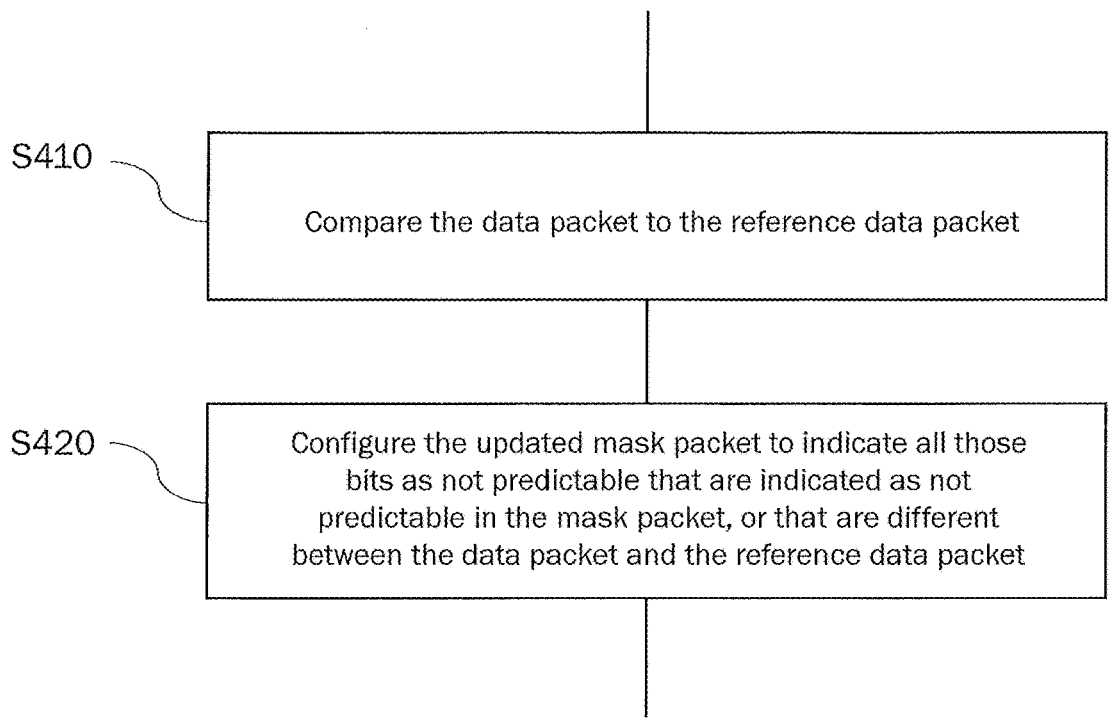
FIG. 4 is a flow chart schematically illustrating details of the method of FIG. 2, FIG. 5 schematically illustrates an overview over some steps of FIG. 2.

FIG. 4 is a flow chart schematically illustrating details of step S240 of FIG. 2. At step S410, the data packet is compared to the reference data packet. Typically, this comparing involves obtaining a (bit-wise) XOR of the data packet and the reference data packet. The result of this XOR of the data packet and the reference data packet will be referred to as intermediate data packet. At step S420, the updated mask packet is configured to indicate all those bits as not predictable that are indicated as not predictable by the mask packet, or that are different between the data packet and the reference data packet (i.e., bits for which the intermediate data packet has a bit with bit value '1'). In other words, step S420 comprises determining, as mismatched bits, all those bits (e.g., bit positions) of the data packet that are indicated as predictable by the mask packet but that are not identical to bits at corresponding bit positions in the reference data packet, and updating the mask packet to indicate bits at the positions of the mismatched bits as bits that are not predictable (in addition to any bits previously indicated as not predictable), thereby obtaining the updated mask packet. Typically, the updated mask packet is obtained by a (bit-wise) OR of the mask packet and the intermediate data packet. By virtue of step S420, the number of bits that are indicated as predictable is reduced from data packet to data packet.

Figure 5:
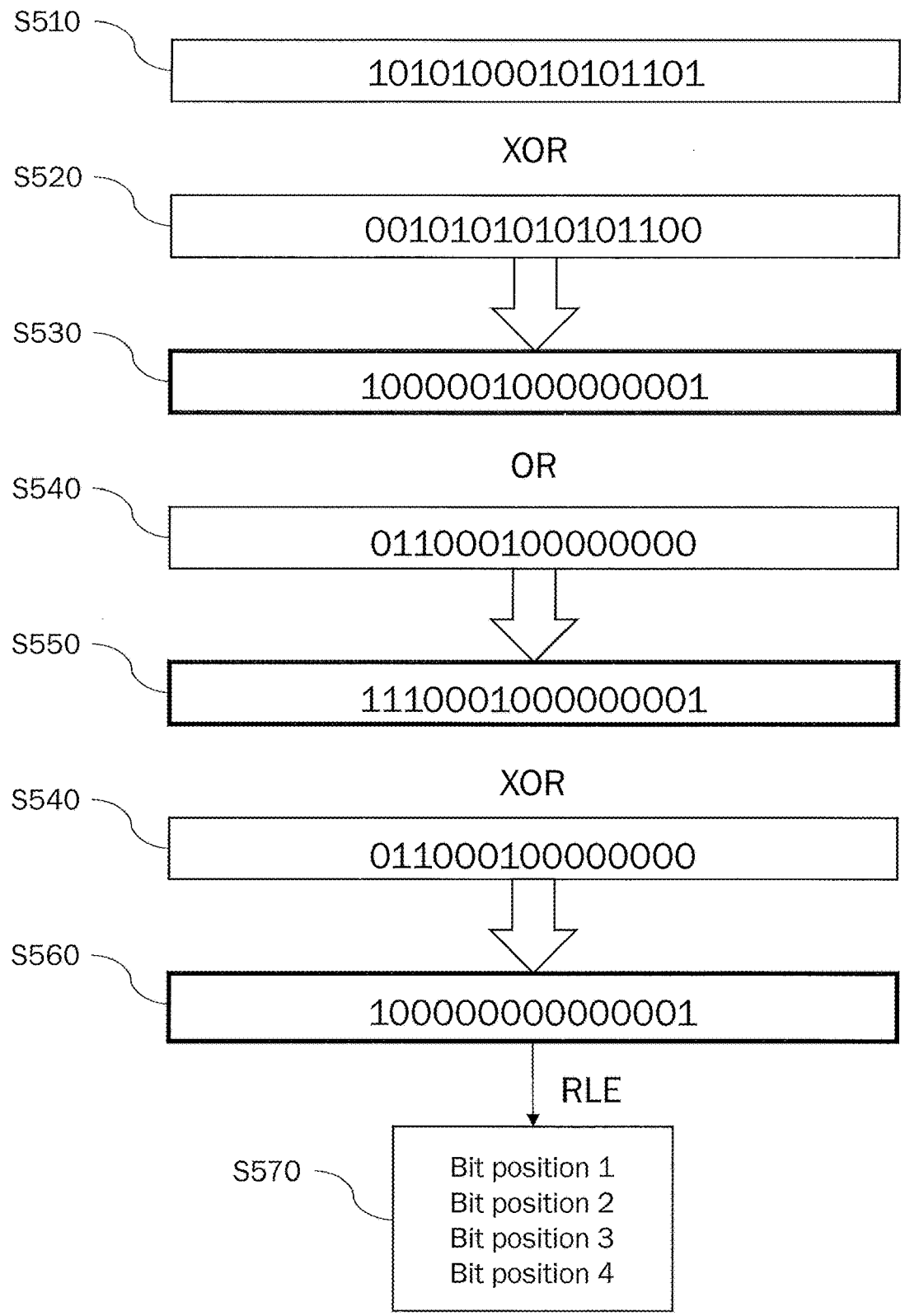

FIG. 5 schematically illustrates an overview of steps S240 and S250 of FIG. 2. The current data packet 510 is XORed (bit-wise XOR) with the reference data packet 520 to obtain the intermediate data packet 530. The intermediate data packet 530 is needed for updating the mask packet. The intermediate data packet 530 indicates all those bits that are mismatched between the current data packet 510 and the reference data packet 520. This corresponds to the processing of step S410 in FIG. 4. Then, the intermediate data packet 530 is ORed (bit-wise OR) with the mask packet 540 to obtain the updated mask packet 550. This corresponds to the processing of step S420 in FIG. 4.

Figure 6:
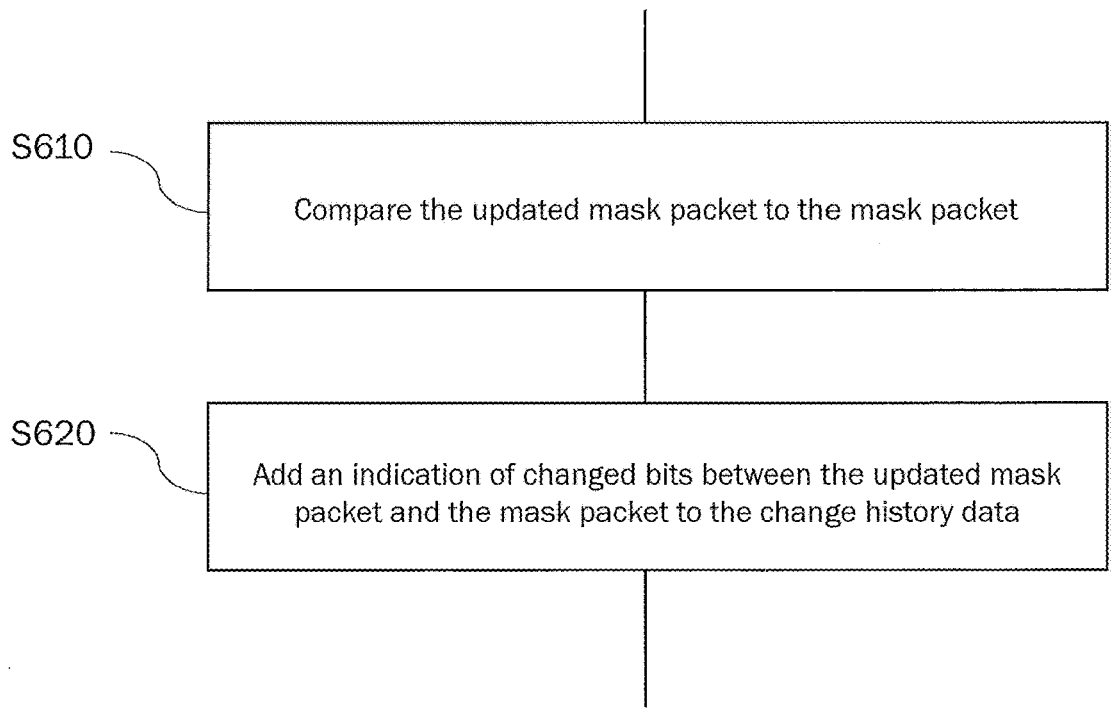
FIG. 6 is a another flow chart schematically illustrating further details of the method of FIG. 2, FIG. 7A and FIG. 7B schematically illustrate an example of an update process of the change history data, FIG. 8 schematically illustrates further details of the method of FIG. 2, FIG. 9 schematically illustrates an example of a representation of updated change history data, FIG. 10 schematically illustrates an example of an encoded data packet.

FIG. 6 is a flow chart schematically illustrating details of step S250 of FIG. 2. At step S610, the updated mask packet (obtained at step S240 or step S420) is compared to the mask packet. Typically, this comparing involves obtaining a (bit-wise) XOR of the updated mask packet and the mask packet. At step S620, an indication of changed bits between the updated mask packet and the mask packet is added to the change history data (obtained at step S230). Determining the indication of the changed bits between the updated mask packet and the mask packet typically comprises run-length encoding the (bit-wise) XOR of the updated mask packet and the mask packet. This would yield an array of counts (runs) between respective bit changes, or correspondingly, an array of bit positions of respective bit changes. As indicated above, the change history data includes, for each indication of a changed bit (bit change, or simply change), an indication of a bit position (e.g., count) of the changed bit within the mask packet, and an indication of the change type of the change (e.g., first type (positive change)—from indicating a bit that is not predictable to indicating a bit that is predictable (from first bit value to second bit value), or second type (negative change)—from indicating a bit that is predictable to indicating a bit that is not predictable (from second bit value to first bit value)). Notably, the bit changes determined at step S620 are negative changes.

Figure 14A:
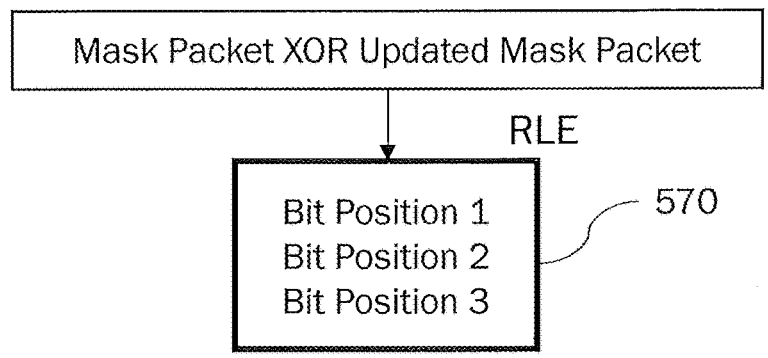

Returning to FIG. 5, the updated mask packet 550 and the mask packet 540 are XORed (bit-wise XOR) to obtain a delta mask packet 560. This corresponds to the processing of step S610. Then, the XOR of the updated mask packet 550 and the mask packet 540 (i.e., the delta mask packet 560) is run-length encoded to obtain, as an indication of the changed bits between the updated mask packet 550 and the mask packet 540, a negative array 570 (an array of bit positions or, alternatively, counters). This indication is then used to update the change history data. Each of the bit positions of the negative array 570 indicates a negative change (from previously indicating a bit that is predictable to now indicating a bit that is not predictable). The change history data is updated by indicating, at respective bit positions indicated by the negative array 570, a respective change (negative change). Generation of the negative array 570 by run-length encoding an XOR of the mask packet 540 and the updated mask packet 550 is also schematically illustrated in FIG. 14A.

FIG. 7A and FIG. 7B schematically illustrate an example of an update process of the change history data. FIG. 7A shows an example of the negative array 570 as well as an example of the change history data 300 before updating. The change history data 300 already indicates bit changes at bit positions 10, 20, and 25 of the mask packet. The negative array 570 indicates further bit changes at bit positions 25 and

60. As can be seen from the example of the change history data 300' after updating (i.e., of updated change history data) in FIG. 7B, the entry in the third row of the change history data 300 is overwritten (bit position 25), and a new entry is added in the fourth row (bit position 60). Notably, the age ID fields 320 of the overwritten and inserted bit change indicates these bit changes to be the most recent changes.

When updating the change history data, negative changes (as indicated by the negative array 570) always supersede (overwrite) previous changes at the same bit position. An overview of rules for other change types will be given further below.

Typically, the updated change history data after encoding the current data packet is obtained as the change history data for the subsequent data packet. In other words, for each data packet, the obtained change history data is the updated change history data after processing the respective preceding data packet.

Figures 8, 12:
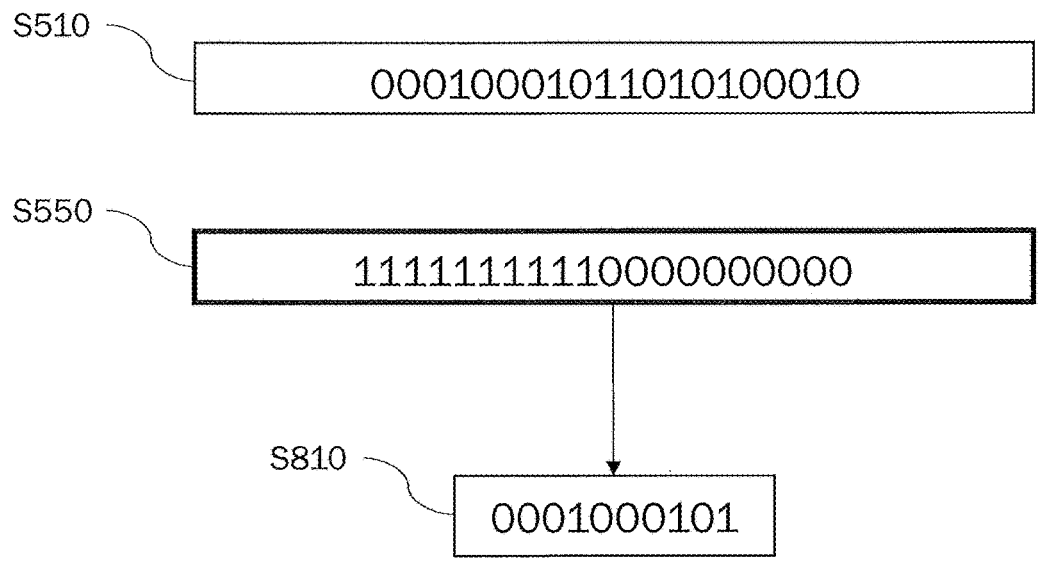

FIG. 8 schematically illustrates an example of obtaining a representation of values of the unpredictable bits 810 for inclusion in the encoded data packet at step S270. In particular, FIG. 8 illustrates examples of the (current) data packet 510 and the updated mask packet 550. Extracting the unpredictable bits 810 comprises reading bit values of the data packet 510 if the corresponding bit of the updated mask packet is set to '1' (i.e., indicates the corresponding bit in the data packet 510 as not predictable). In the example of FIG. 8, the first ten bits are read from the data packet 510 as unpredictable bits. A representation of the unpredictable bits 810 is inserted into the encoded data packet for the data packet 510 at step S270 of FIG. 2.

Figure 9:
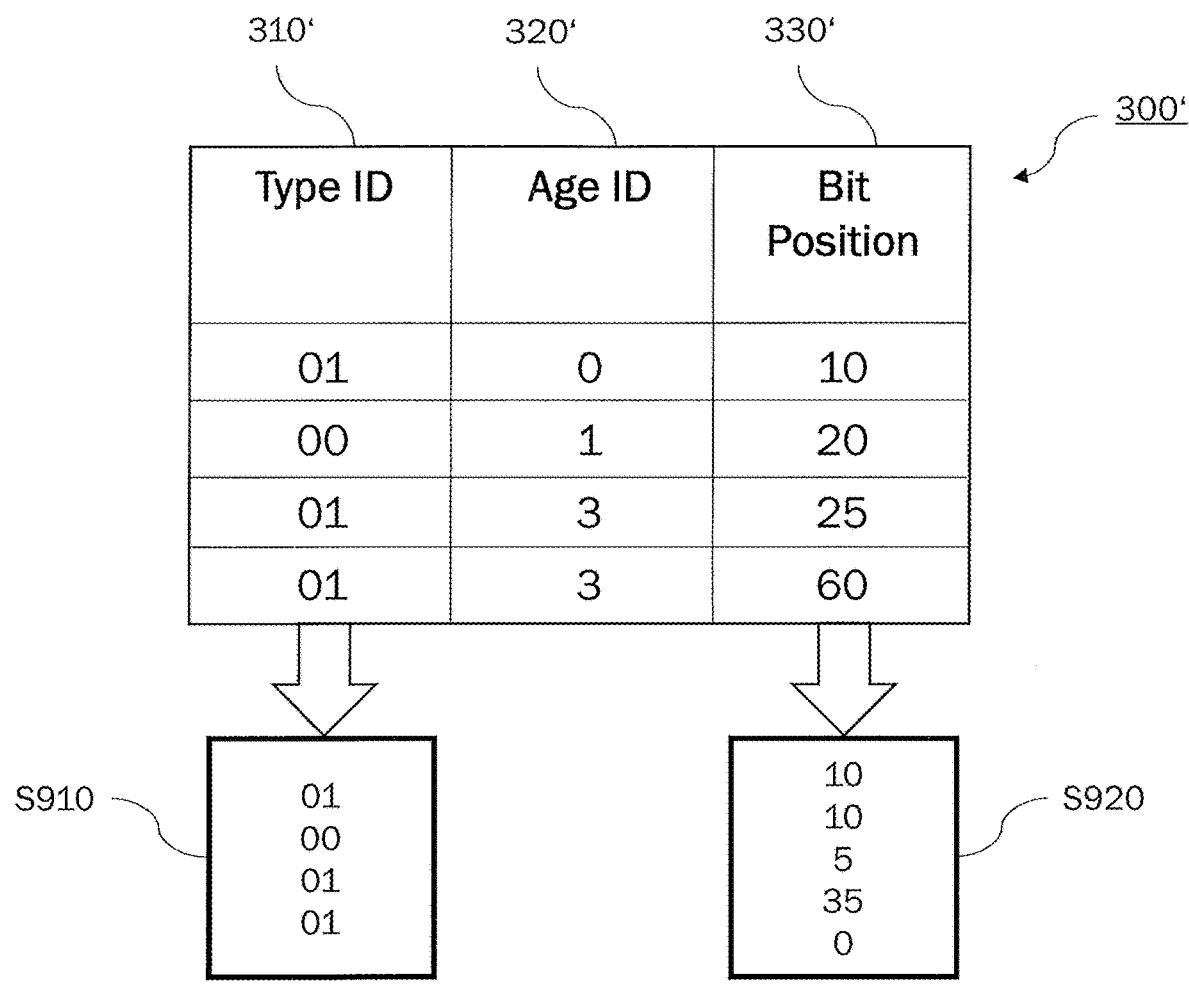

FIG. 9 schematically illustrates an example of a representation of updated change history data 300' that is included in the encoded data packet at step S270. In this example, the representation includes a type ID array 910 and a count array 920. The count array 920 is created by sequentially reading the bit position fields 330' of the entries of the array of changes of the updated change history data 300' and by calculating the differences (deltas) between subsequent bit position entries. By default, it ends with a zero count if the data packet length is not reached. The type ID array 910 is created by sequentially reading the type ID fields 310' of the entries of the array of changes of the updated change history data 300'. The process of generating the count array 920 and the type ID array 910 may be referred to as issuing the change history data. In general, the representation of the updated change history data 300' may at least include a representation of bit positions (e.g., in the form of counts) of respective changes.

By including the representation of the updated change history data 300' (mask evolution history, or mask evolution history data) in the encoded data packet at step S270, information on how the mask packet has evolved between multiple data packets is sent in each encoded data packet. This allows to link the current data packet with data packets earlier than the immediately preceding one in the chain and therefore makes the system very robust to packet loss. If it is chosen to link the current data packet to data packets that were produced two cycles ago, the system can deal with single packet loss. If the current data packet is linked to data packets that were produced three cycles ago, the system can deal with a double sequential packet loss and so on. The depth of the change history data (i.e., how far it reaches back in the sequence of data packets) hence is called the protection level. For example, a protection level of two means that the system is robust to any packet loss scenario that does not involve the loss of three consecutive data packets or more.

Representing the change history data in the form of the count array 920 and the type ID array 910 takes advantage of the fact that the updates to the mask packet are mutually exclusive or have an age priority (e.g., later updates can overwrite earlier ones). Therefore one can use an accumulative OR of all the delta mask packets in the core process of encoding (or in the new mask issue process) to create a single mask evolution history packet. Since the updates to the mask packet are accumulative, it can be assumed that there will typically be very few mask updates as time progresses. Hence it is better to deal with the counters themselves rather than using packets at this stage. The accumulative OR can be emulated by manipulating a mask evolution array of counts. Both the inputs and output of the process are given in this very reduced format, and only very simple mathematical operations are required (e.g., integer addition and subtraction), which makes the process very fast and memory efficient. As indicated above, the output of the issue process comprises an array of counts (the count array 920) ending with a zero count (if the last count entry does not correspond to the data packet length), and a list of bits called extra bits (the type ID array 910), which detail the type of input (change) that has caused each count entry.

The aforementioned output allows the ground to apply the mask evolution history and so link the latest data packet to any data packet in the mask evolution history. The ground simply applies the history in all cases and does not need to know the protection level. Hence the on-board algorithm can change the protection level depending on circumstances if needed, and there is no need to synchronize configuration with the ground. Notably, these links between packets work in both directions if the algorithm needs to work backwards, e.g., from a packet containing anchor information (described below).

Figure 10:
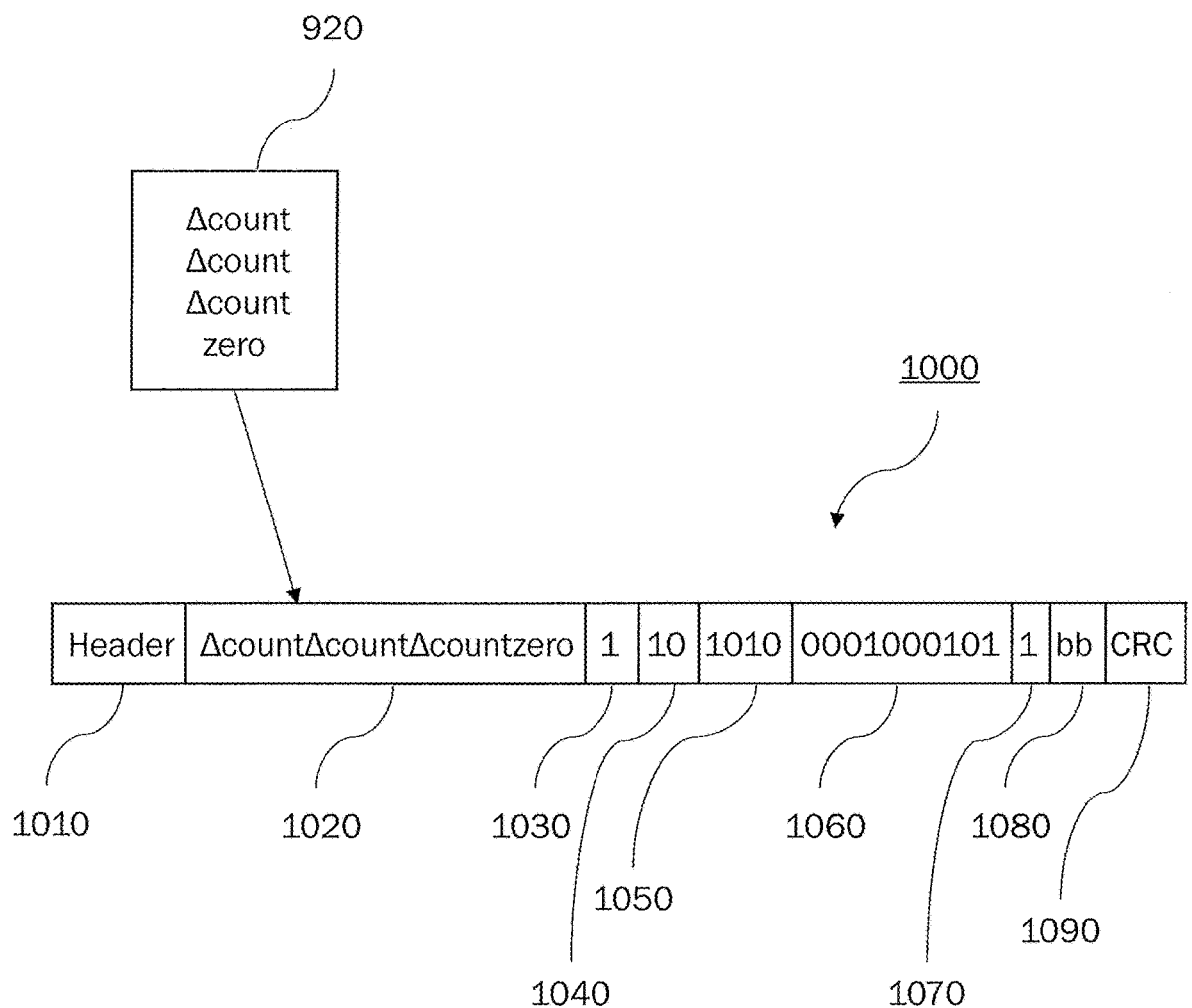

FIG. 10 schematically illustrates an example of an encoded data packet 1000. In this example, the encoded data packet 1000 includes a header 1010, a count field 1020 for including the count array 920, a packet type flag 1030 indicating whether the reference packet for this encoded data packet 1000 is fixed or the previous data packet, a type flag 1040 indicating the number of unique types in type ID array 910, a type ID field 1050 which encodes type ID 910 array according to type flag 1040, an unpredictable bits field 1060 for including the unpredictable bits 810, a future fixed reference flag 1070, a bit stuffing field 1080 for obtaining an encoded data packet that has a given bit length (e.g., an integer number of bytes), and a CRC field 1090 including a CRC checksum of the original data packet. The header 1010 may be identical to the header of the original data packet, however with the length field altered. The decoding side may reconstruct the type ID array 910 by referring to the type flag 1040 and the type ID field 1050. The packet type flag 1030 may have one bit and may indicate a type of the packet. Examples of packet types are fixed reference (e.g., value 0) and previous packet reference (e.g., value 1). The future fixed reference flag 1070 may indicate whether the data packet is to be used as a reference data packet for any subsequent data packets of fixed reference type (e.g., value 0 may indicate that the data packet is not to be used as a fixed reference data packet for future data packets, and value 1 may indicate that the data packet is to be used as a fixed reference data packet for future data packets). Thus, the future fixed reference flag 1070 may be seen as an indication for the decoding side for an update mechanism for fixed reference mode.

In general, generating the encoded data packet 1000 comprises generating the count array 920, determining the unpredictable bits 810, and including these into respective fields of the encoded data packet 1000. Generating the encoded data packet 1000 may further comprise generating the type ID array 910 and inserting it into a respective field of the encoded data packet 1000. Yet further, generating the encoded data packet 1000 may comprise bit stuffing, adding control flags, adding a CRC of the data packet, and replacing the header with an updated length field. Afterwards, the encoded data packet 1000 (compressed data packet) can be re-injected into the packet stream for standard processing.

As indicated above, a data packet may have a packet type that can be one of fixed reference packet or previous packet reference (i.e., chain mode). Each packet type requires a different mask packet. Therefore, switching between packet types requires a packet containing anchor information, as described further below. The evolution of the masks for both packet types can take place in parallel or the switch between packet types can be done cold, i.e., starting from a mask packet where all bits are indicated as predictable when a switch between packet types is made.

Figure 11:
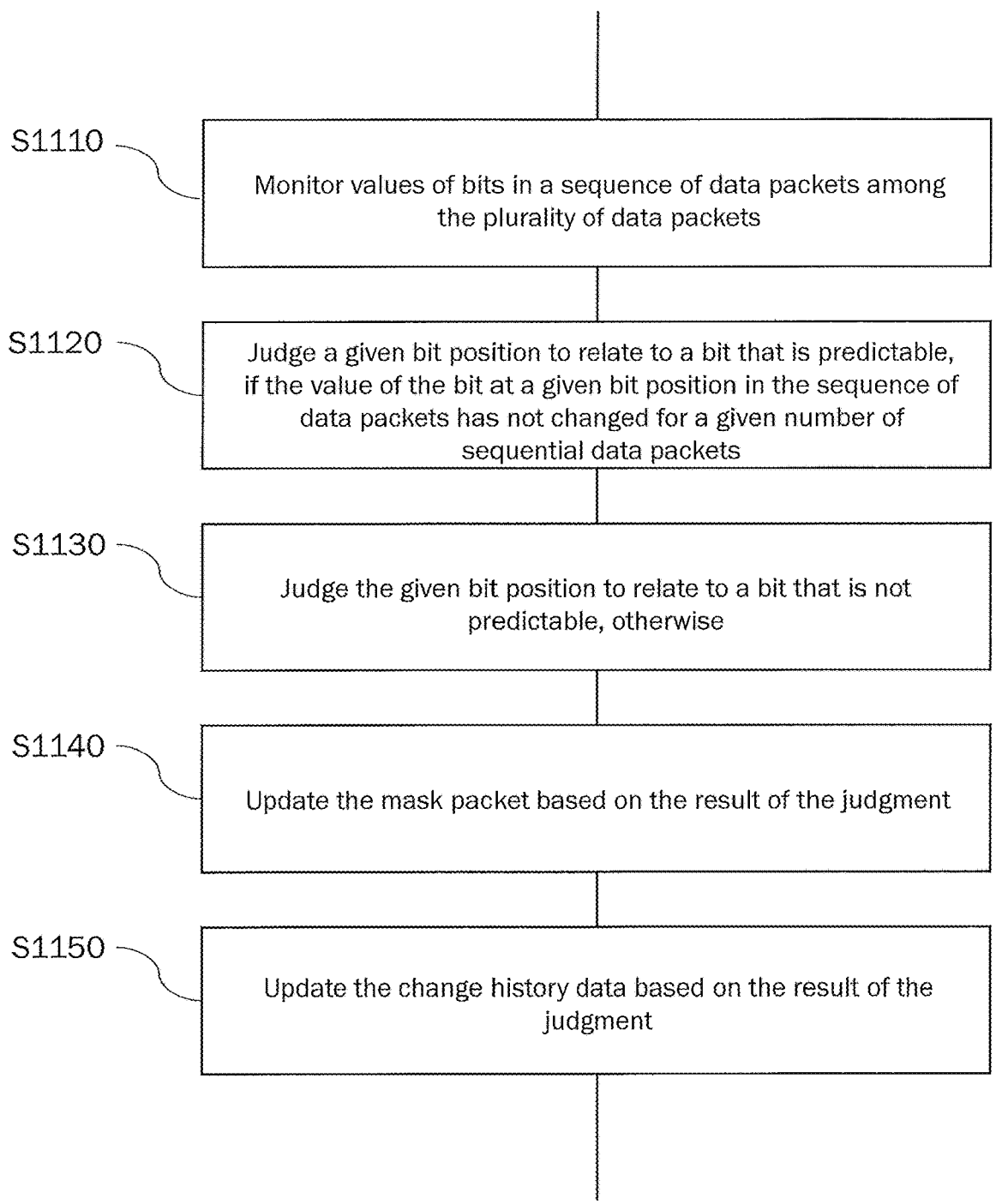
FIG. 11 is a flow chart schematically illustrating additional steps for positively updating the mask packet, FIG. 12 schematically illustrates an example of rules for updating the change history data.

FIG. 11 is a flow chart schematically illustrating additional steps of the method of FIG. 1 for a positive update of the mask packet. As indicated above, the mask packet is negatively updated in every cycle (only in limiting cases, the mask packet may be retained without negative update), but it is not updated positively. This allows to avoid generation of so-called wrong counters that would otherwise be needed to indicate bits that are indicated as predictable bits by the mask packet, but that differ from corresponding bits in the reference data packet. On the other hand, it would be preferable to also have available a mechanism for positive updates, so that bits that are indicated as not predictable but that have behaved properly for a given number of successive data packets (i.e., that have not changed for the given number of data packets) may be re-flagged as predictable bits. Such a mechanism will now be described with reference to FIG. 11. Notably, the process of FIG. 11 may be carried out periodically, on request, or on trigger.

At step S1110, values of bits in a sequence of data packets among the plurality of data packets are monitored. If the value of a bit at a given bit position in the sequence of data packets does not change for a given number of sequential data packets, the given bit position is judged to relate to a bit that is predictable at step S1120. Otherwise, i.e., if the value of the bit at the given bit position in the sequence of data packets does change in the given number of sequential data packets, the given bit position is judged to relate to a bit that is not predictable at step S1130. Then, e.g., after the given number of data packets have been sequentially encoded, or periodically, on request, or on trigger, the mask packet is updated based on a result of the judgement at step S1140. Updating the mask packet based on the result of the judgement may comprise updating the mask packet to indicate, as bits that are predictable, all those bits at bit positions that have been judged as relating to bits that are predictable. Further, at step S1150, the change history data is updated based on the result of the judgement.

Figure 14B:
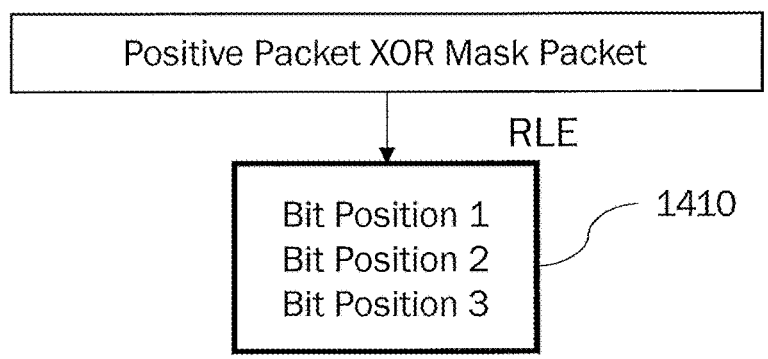

For example, monitoring the values of the bits in the sequence of data packets may proceed by initializing a positive packet (positive mask packet) to indicate all bits as predictable (e.g., all bits set to '0'). The positive packet has the same length (in terms of bits) as the data packets and the mask packet. For each data packet among the given number of sequential data packets, the positive packet may be updated to indicate bits (e.g., bit positions) as not predictable if these bits are not identical to corresponding bits in the reference data packet (e.g., the respective preceding data packet). Updating the mask packet based on the result of the judgment may then comprise setting the mask packet to the positive packet. The change history data may be updated accordingly (e.g., by adding indications of bit changes of first type (positive changes) to the mask packet). To this end, a positive array may be generated by obtaining a (bit-wise) XOR of the positive packet and the mask packet (before setting the mask packet to the positive packet) and run-length encoding the resulting XOR. The positive array may be used to update the change history data in the manner explained below with reference to FIG. 12. Generation of the positive array 1410 by run-length encoding an XOR of the positive packet and the mask packet is also schematically illustrated in FIG. 14B. After setting the mask packet to the positive packet and updating the change history data, the positive packet may be initialized again to indicate all bits as predictable.

In general, when an array indicative of changes (e.g., negative array 570 or positive array 1410) arrives for updating the change history data, each entry of the array indicative of changes is inserted into the change history data (mask evolution history) and ordered by bit position. If an entry (indicative of a change) for a given bit position already exists, that entry may be overwritten, or the new entry may be discarded, depending on a set of rules that will be described with reference to FIG. 12. As indicated above, negative changes to the mask packet may overwrite earlier changes in the change history data at the same bit position. Further types of changes are positive changes, as described above with reference to FIG. 11, as well as changes relating to anchor information.

Table 1200 shown in FIG. 12 has a first column 1210 indicating a type of update (type of change), a second column 1220 indicating a type ID, and a third column 1230 indicating whether the respective change overwrites an earlier change at the same bit position. As can be seen from FIG. 12, negative changes (type ID '01') always overwrite existing entries of the change history data. This is necessary in order to avoid that wrong counters need to be issued for bits in the data packet that are indicated as predictable bits, but that differ from the respective reference data packet. For positive changes (type ID '00'), the question of overwriting does not arise, since these changes are implemented by setting the mask packet to the positive packet described with reference to FIG. 11. Changes relating to anchor information (type ID '10') do not overwrite existing entries. All new entries are given an age ID of zero (indicating most recent changes). Further, all new entries are given a type ID in accordance with the second column 1220 of FIG. 12.

Next, generation of a packet containing anchor information will be described. Since the proposed method evolves the mask packet in every cycle (instead of evolving the reference data packet), a problem occurs when track of that evolution is lost for some reason. Part of problem is solved by linking the data packets by means of the change history data (mask evolution history), as described above. If the overall degree of protection of the system is to be increased, encoded (e.g., compressed) data packets can be introduced, e.g., periodically, or on request, or on trigger, that can be decoded (e.g., decompressed) without the need for prior mask information. These packets include a self-sufficient representation of the (updated) mask packet last used (i.e., used for encoding the respective data packet) by the encoding side. This is referred to as anchor information.

Generation of a packet containing anchor information may involve the following steps: Horizontally XOR the updated mask packet, run-length encode the horizontal XOR to produce a count array (notably, the count array is delimited with a count of zero; a count of zero indicates either that the run packet continues with no more '1's, or that the end of the run packet has been reached), determine the unpredictable bits for the unpredictable bits field using the updated mask packet, bit stuff, add control flags and CRC if necessary, and replace the original header with an updated length field. The compressed (anchor) packet can then be re-injected into the packet stream for standard processing.

Thanks to the accumulative nature of the change history data, it is possible for the decompression algorithm to jump backwards in time from a packet containing anchor information to decompress the packet preceding it by the number indicated in the protection level and previously stored but not decompressed. Then it can work forwards to decompress the intermediate packets. Therefore if the chain should be broken for some reason, once the ground receives the next packet containing anchor information, it can decompress the packet containing anchor information, as well as any previous data packets and future data packets from this point (up to a distance in packets determined by the protection level).

All data packets that have been compressed using the method according to the disclosure can be decompressed using multiple data packets as reference data packets. In fact any data packet that was successfully decompressed on the ground while the present mask packet was being created or used can be used for this purpose. This provides a great deal of redundancy. Taking the example of a positive mask update taking place every twenty data packets, a packet containing anchor information can use as a minimum any of the previous twenty data packets and a maximum of any of the last forty data packets to decompress. Now there will be situations when even a redundancy of twenty to forty packets is not enough (e.g., between passes of a spacecraft). This can simply be dealt with by sending a packet containing anchor information in the case of fixed reference packet types and an uncompressed data packet (that can be used as a reference data packet by the ground) followed by a packet containing anchor information in the case of the previous reference packet type.

Figure 13:
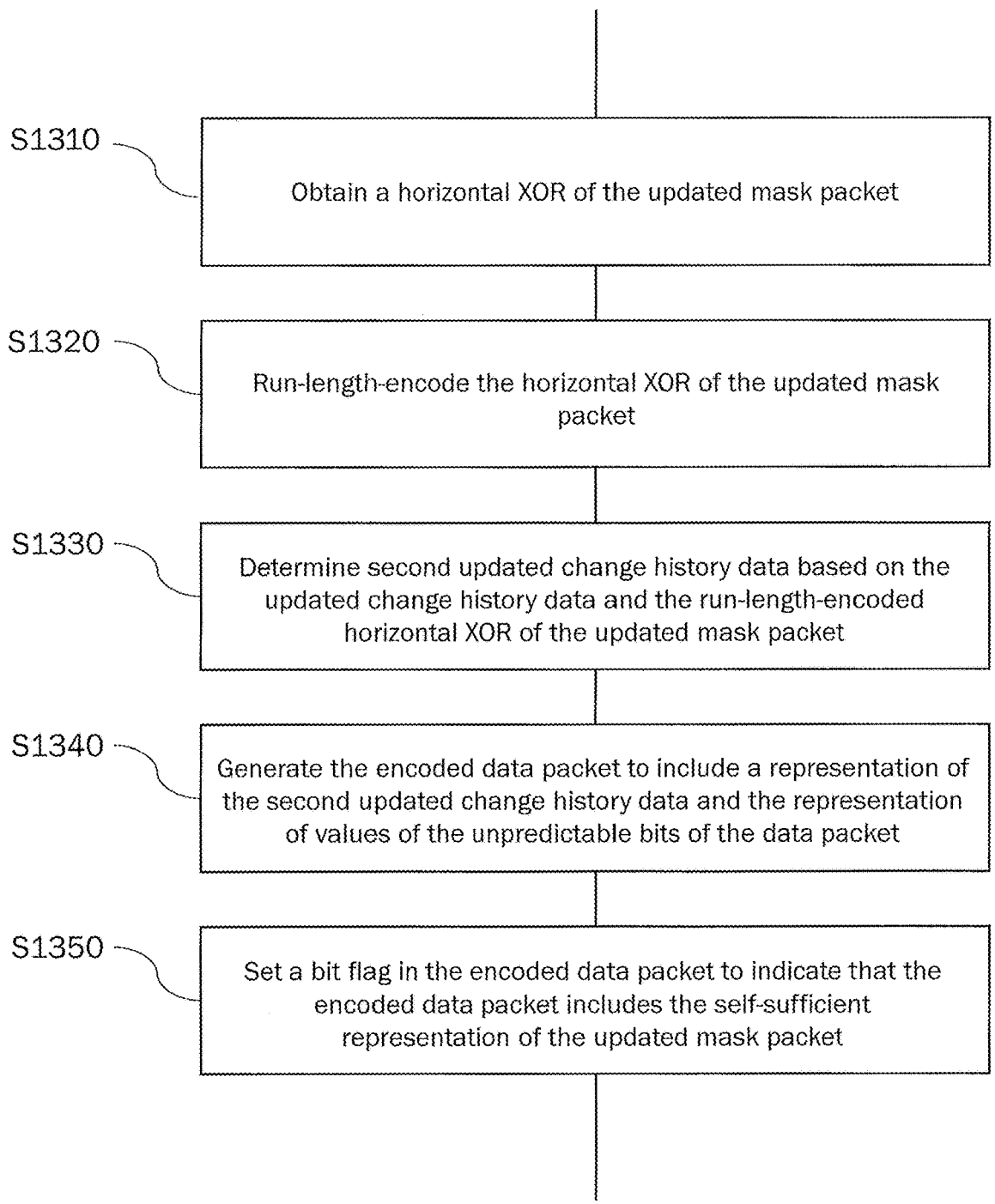
FIG. 13 is a flow chart schematically illustrating additional steps for generating a packet containing anchor information, FIG. 14A, FIG. 14B and FIG. 14C schematically illustrate examples of processes for generating a negative array, a positive array, and an anchor array, respectively, for updating the change history data.

FIG. 13 is a flow chart schematically illustrating additional steps of the method of FIG. 1, for generating a packet containing anchor information. As indicated above, a packet containing anchor information is an (encoded) data packet (of either fixed reference or previous reference type) that also includes a self-sufficient representation of the (updated) mask packet.

At step S1310, a horizontal XOR of the updated mask packet is obtained. To this end, the updated mask packet is shifted by one bit to the right, the last bit is removed, and the first bit of the updated mask packet is added as the first bit of the shifted updated mask packet. For instance, an (updated) mask packet '1010011011101' yields a shifted (updated) mask packet '1101001101110'. That is, a horizontal XOR of a sequence of bits (such as a mask packet) is an XOR between the sequence of bits and the sequence of bits shifted by one bit, e.g., to the right. Alternatively, also a bit shift by one to the left could be used. In either case, the decoding side would apply a reverse of the horizontal XOR that is performed at the encoding side.

At step S1320, the horizontal XOR obtained at step S1310 (the horizontal XOR of the updated mask packet) is run-length encoded. The run-length-encoded horizontal XOR of the updated mask packet may be said to represent information (e.g., absolute mask information) that enables reconstructing the updated mask packet from scratch (e.g., starting out from a mask packet that is initialized to all '0's). The run-length encoded horizontal XOR of the updated mask packet corresponds to an anchor array that is a special type of an array indicative of changes for updating the change history data in the manner described above with reference to FIG. 12.

At step S1330, second updated change history data is determined based on the updated change history data and the run-length-encoded horizontal XOR of the updated mask packet. The updating of the updated change history data may proceed as described above with reference to FIG. 12, wherein the run-length encoded horizontal XOR of the updated mask packet constitutes an array indicative of changes (anchor array). When updating the updated change history data, bit changes corresponding to the horizontal XOR of the updated mask packet may be indicated to have a change type that is of a third type (e.g., change type 'anchor') indicating that these bit changes relate to a self-sufficient representation of the updated mask packet (e.g., change type 'anchor'). Bit changes of other change types in the updated change history data (e.g., first type (positive change), second type (negative change)) may not be superseded (e.g., overwritten) at this stage. Notably, when managing the change history data before processing the next data packet (see further below), any bit changes that are of the third change type may be removed from the change history data.

At step S1340, the encoded data packet is generated to include a representation of the second updated change history data and the representation of values of the unpredictable bits of the data packet. This step replaces step S270 in FIG. 2, or modifies said step S270 by including the representation of the second updated change history data instead of the representation of the updated change history data in the encoded data packet.

At step S1350, a bit flag in the encoded data packet is set to indicate that the encoded data packet includes the self-sufficient representation of the updated mask packet. This may correspond to setting the packet type flag to a value indicating that the encoded data packet includes the self-sufficient representation of the updated mask packet, i.e., is a packet containing anchor information.

Figure 14C:
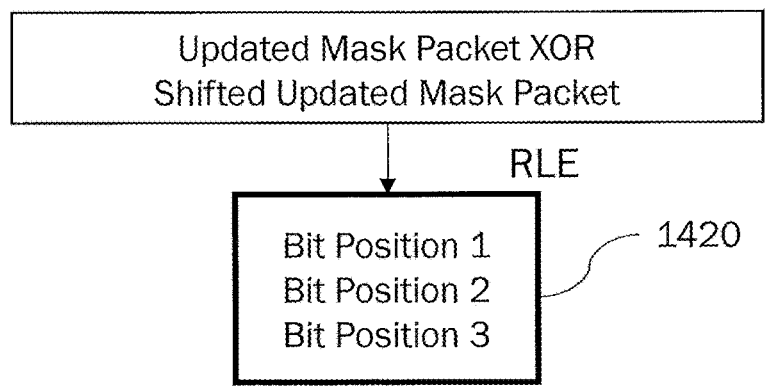

Generation of the anchor array 1420 by run-length encoding an XOR of the updated mask packet and the shifted updated mask packet is also schematically illustrated in FIG. 14C. As indicated above, the shifted updated mask packet is obtained by shifting the updated mask packet by one bit to the right, by removing the last bit, and by adding the first bit of the updated mask packet as the first bit of the shifted updated mask packet.

After the (current) data packet has been encoded, i.e., after the encoded data packet for the (current) data packet has been generated, and before the next data packet is encoded, the updated change history data (or second updated change history data, if applicable) is managed. In particular, the age ID of all entries is incremented by one, and entries whose age ID exceeds a (configurable) maximum number after the incrementing are removed from the change history data. The (configurable) maximum number is referred to as the protection level plus one. Mask packets that lie back more than the maximum number of packets cannot be constructed using the change history data. Likewise, a validly reconstructed mask packet that lies back more than the maximum number of data packets cannot be used to reconstruct a current mask packet using the change history data. All entries corresponding to anchor information are also removed from the change history data at this point.

In summary, the following processes are performed in the context of encoding (e.g., compression):

The following actions are performed for every cycle (i.e., for every data packet to be encoded): The reference data packet is obtained, the intermediate data packet is obtained (e.g., generated) (intermediate data packet=current data packet XOR reference data packet, e.g., current data packet XOR preceding data packet), the mask packet is obtained and updated using the intermediate data packet (updated mask packet=mask packet OR intermediate data packet), the negative array is obtained (e.g., generated) by comparing the updated mask packet and the mask packet, and run-length encoding the result thereof, the change history data (mask evolution history) is updated based on the negative array, and the unpredictable bits are obtained (e.g., generated) using the updated mask packet and the current data packet. Further, the positive packet is updated (positive packet is ORed with the intermediate data packet).

The following actions may be performed periodically, on request, or on trigger, and may be performed in addition to the aforementioned actions: The anchor array is obtained (e.g., generated), and the change history data is updated based on the anchor array.

The following actions are again performed for every cycle, in addition to the aforementioned actions: The packet type flag is generated (optional), the future fixed reference flag is generated (optional), the (updated) change history data is issued (i.e., the count array and the type ID array are generated), and the change history data is managed.

The following actions again may be performed periodically, on request, or on trigger, and may be performed in addition to the aforementioned actions: The positive array is generated, the change history data is updated based on the positive array, the mask packet is set to the positive packet, and the positive packet is reset to indicate all bits as predictable.

Next, decoding (e.g., decompression) of encoded data packets will be described. In order to decode an encoded data packet, the following is required: the reference data packet, the mask packet, and the unpredictable bits. In short, the following steps are applied:

The header is read to see if POCKET-type packet processing (i.e., processing in accordance with the method of the present disclosure) is required. The packet length is read from the header, and the last two bytes for CRC may be read and stored. The counter field starting from the header end is read, wherein the last count is a zero value or the cumulative count is equal to the data packet length. The entry column and the bit position column of the mask evolution history array are recreated from the counts. The packet type flag bits are read to determine the reference packet to use. The types flag and type ID field are read to determine the meaning of each counter. Finally, the type column of the mask evolution history array is recreated. Needless to say, one or more of the aforementioned steps may be omitted or may be modified, depending on characteristics of the encoded data packet (e.g., depending on the data fields included in the encoded data packet and/or the arrangement of data fields within the encoded data packet).

The counts (from the count array 920) are read and separated into the different change types (the type ID array 910). Accordingly, a set of changes characterized by their change type (e.g., positive, negative, or anchor) and their bit position within the mask packet is obtained. This allows to apply these changes to the ground mask (the mask packet available to the ground, e.g., the mask packet after decoding the preceding data packet, or any other mask packet used less than the protection level prior to the current data packet). The change history data is then (blindly) applied to the ground mask, i.e., the ground mask is updated using the change history data (more precisely, the entries of the change history data, e.g., the entries of the array of changes described above with reference to FIG. 3). For example, for a positive change, the corresponding bit in the mask packet is set to '0' (or, in general, to the bit value indicating a bit that is predictable). For a negative change, the corresponding bit in the mask packet is set to '1' (or, in general, to the bit value indicating a bit that is not predictable). For a packet containing anchor information, the counts (from the count array 920) are read to produce the horizontal XOR of the mask packet (the updated mask packet used for encoding the current data packet). The horizontal XOR is reversed in order to recover the ground mask. This may involve resetting the ground mask to all '0's and initializing a preceding bit to '0'. Recovering the ground mask may further involve iterating (cycling) through the ground mask bits sequentially and applying the following actions: If there is no entry in the change history data for the respective bit position, then set the corresponding bit in the ground mask to the same bit value as the preceding bit. If there is an entry in the change history data for the respective bit position, then set the corresponding bit in the ground mask to '0' if the entry relates to a positive change, or set the corresponding bit in the ground mask to '1' if the entry relates to a negative change. Alternatively, if the entry in the change history data for the respective bit position is of type 'anchor', then set the corresponding bit in the ground mask to the inverse of the preceding bit.

Then, the ground mask is used to determine the number of unpredictable bits (the number of bits in the ground mask that indicate corresponding bits in the data packet to be not predictable). The number of unpredictable bits corresponds to the length of the unpredictable bits field 1060 of the encoded data packet. Thus, knowing the number of unpredictable bits allows to extract the unpredictable bits from the encoded data packet. The contents of the reference data packet are copied to a buffer, which may be referred to as a decoded (e.g., decompressed) packet buffer.

The ground mask and the reference data packet are then read bit by bit, and the following rules are applied for each bit position:

If the ground mask bit='1' (or, in general, has the value indicating a bit that is not predictable), then read the next bit in the array of unpredictable bits (the array having been extracted from the encoded data packet) and insert that bit into the decoded data packet (in the buffer) at the respective bit position. Otherwise, leave the bit in the decoded data packet (in the buffer) as is, i.e., retain the value of the bit in the reference data packet at the respective bit position.

Once all bits of the ground mask have been processed, the decoded data packet has been reconstructed and can be read from the buffer. Optionally, a CRC of the decoded data packet can be performed. The decoded data packet can then be set as the reference data packet for the next data packet that is to be decoded.

Finally, the future fixed reference flag is extracted from the encoded data packet and stored. If the future fixed reference flag was set, the decoded data packet can be set as the fixed reference data packet for subsequent data packets that make reference to such fixed reference data packet i.e. fixed reference type packets.

The beauty of the above-described decompression process is its simplicity and robustness. Even when packets are compressed using the previous packet as the reference packet, multiple reference data packets can be used to decompress them. Any data packet that was successfully decompressed on the ground, or sent uncompressed, while the present mask was being created or used can be used, which provides a great deal of redundancy. Taking the example of a (positive) mask update taking place every twenty packets, a packet containing anchor information can use as a minimum any of the previous twenty data packets and a maximum of any of the last forty data packets to decompress (provided a sufficiently high protection level).

Further, all the decompression process has to do is to apply the mask evolution history of the mask blindly to its present mask packet in all cases to ensure its consistency. It does not need to care how many data packets (cycles) that mask evolution history is constructed from, so that the protection level can be changed on-board autonomously if necessary. Missing data packets have no impact as long as they are contained (e.g., reflected) in the mask evolution history.

Further, the mask evolution history is set as a single set of run-length encoded counters. This makes the compression very efficient. There is no need for special packets and the information can be sent multiple times for providing time redundancy.

Yet further, the decompression algorithm does not need to make assumptions about the compression algorithm configuration. It can decompress any mixture of, uncompressed packets and normally compressed packets. Also it can handle any change of protection level, mask generation time, etc., without external input.

Figure 15:
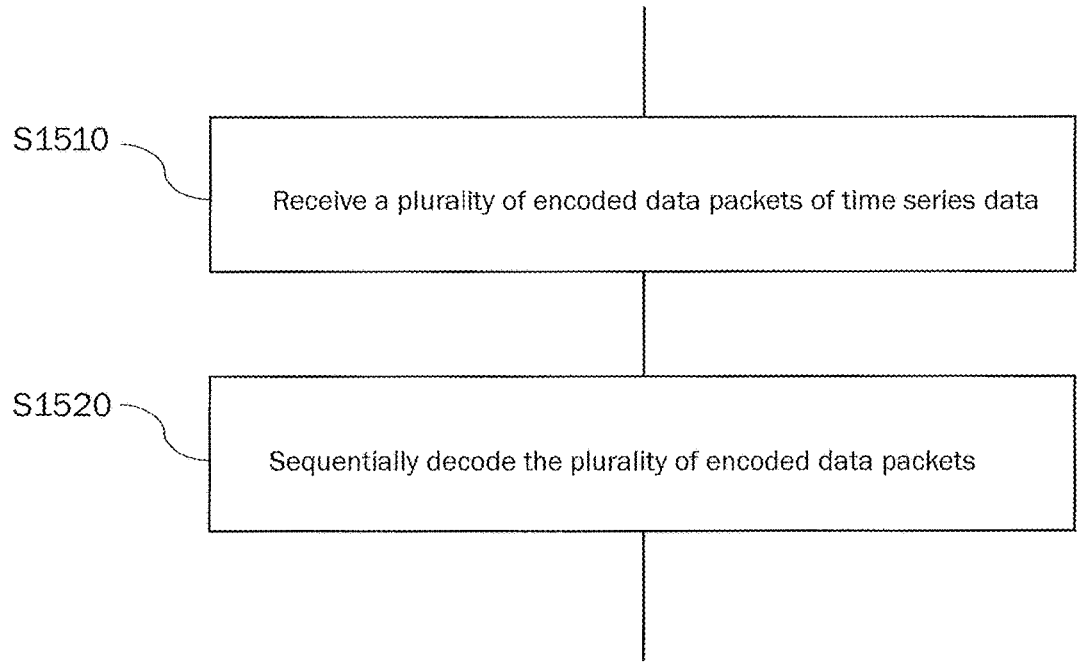
FIG. 15 is a flow chart schematically illustrating a method of decoding (e.g., decompressing) time series data according to embodiments of the disclosure.

FIG. 15 is a flow chart schematically illustrating a method of decoding (e.g., decompressing) time series data according to embodiments of the disclosure. The method can decode a plurality of encoded data packets of time series data into corresponding decoded data packets of time series data.

At step S1510, a plurality of encoded data packets of time series data are received. The data packets all may have the same length in terms of bits. The time series data may relate to telemetry data (e.g., housekeeping telemetry data) and may indicate values of a plurality of parameters that indicate a state of a monitored system. The monitored system may be a spacecraft (e.g., satellite), or a system aboard a spacecraft. Each encoded data packet includes a representation of change history data (mask evolution history) and a representation of values of unpredictable bits of the corresponding decoded data packet (or the corresponding data packet that has led to the encoded data packet, i.e., the corresponding data packet before encoding). The change history data is indicative of previously changed bits of a mask packet (e.g., used for encoding the respective data packet), wherein the mask packet is indicative of which of the bits (e.g., bit positions) in the corresponding decoded data packet are predictable and which of the bits in the corresponding decoded data packet are not predictable. Predictable bits may be bits that are expected to be identical to corresponding bits in the reference data packet. Unpredictable bits may be bits that are not expected to be identical to corresponding bits in the reference data packet. Those bits may or may not be identical to respective bits in the reference data packet. The mask packet may have bits set to a first bit value (e.g., '1') for positions of bits that are not expected to be identical to corresponding bits (i.e., bits at corresponding bit positions) in the reference data packet, and set to a second bit value (e.g., '0') for positions of bits that are expected to be identical to corresponding bits in the reference data packet. However, depending on circumstances, also the converse assignment of '0' and '1' may be chosen. Values of bits that are indicated as expected to be identical to corresponding bits in the reference data packet are not encoded in the encoded data packet for the data packet, since they can be inferred from the reference data packet and the mask packet.

Then, at step S1520, the plurality of encoded data packet are sequentially decoded (e.g., decompressed). Each encoded data packet may be decoded during a respective cycle.

Figure 16:
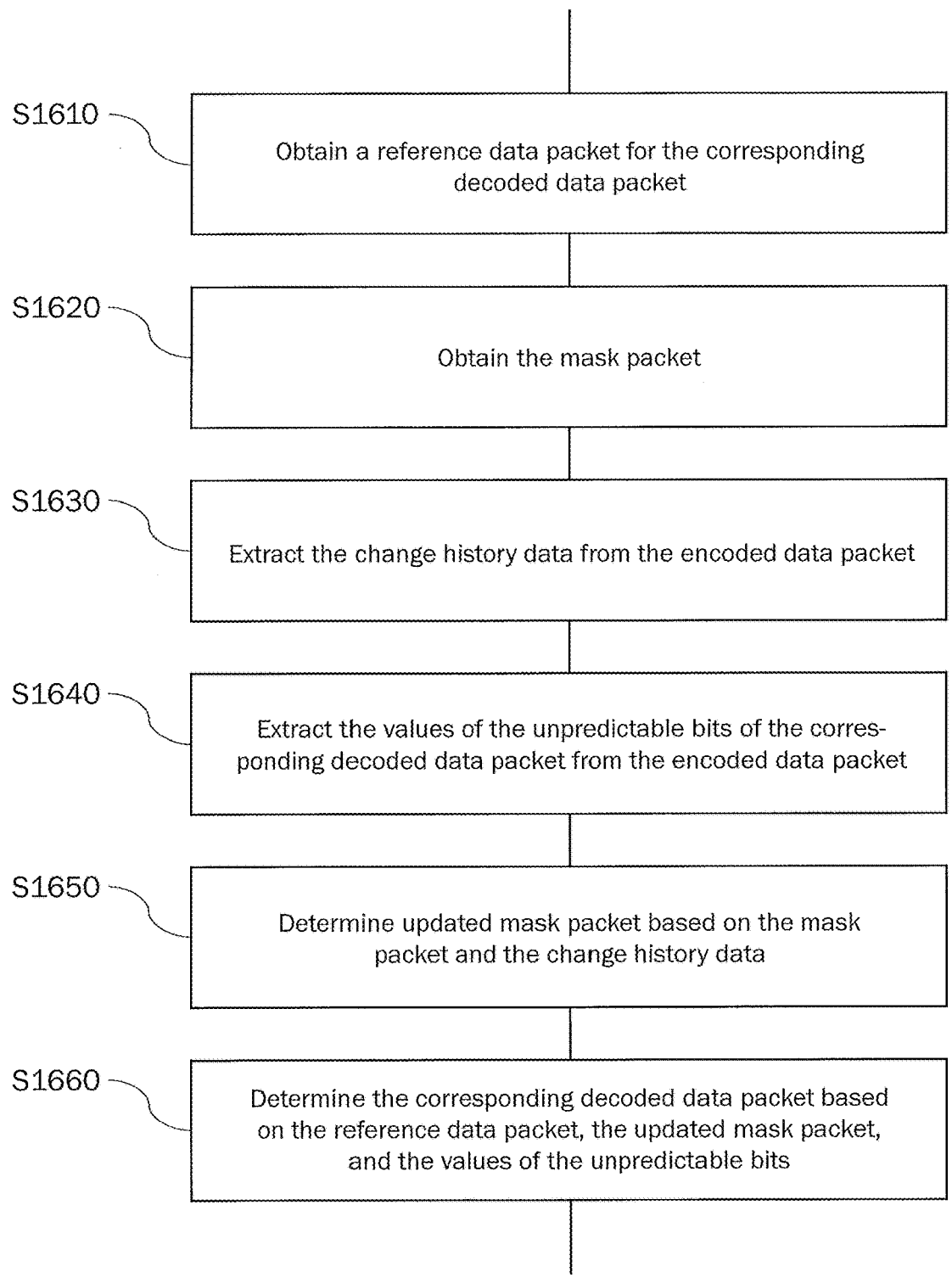
FIG. 16 is a flow chart schematically illustrating details of the method of FIG. 15.

FIG. 16 is a flow chart schematically illustrating details of step S1520 of FIG. 15. Steps S1610 to S1660 of FIG. 16 are performed for an encoded data packet among the plurality of encoded data packets. For example, the aforementioned steps may be performed for each encoded data packet that is received at step S1510 in FIG. 15.

At step S1610, a reference data packet is obtained for the respective encoded data packet (or equivalently, for the corresponding decoded data packet). The respective encoded data packet may also be referred to as the current encoded data packet. The reference data packet preferably is the decoded data packet preceding the current encoded data packet, i.e., the data packet last decoded. However, for specific data packets, the reference data packet to be used may also be a fixed reference data packet, as has been described above. In general, any decoded data packet since the next-to-last positive update of the mask packet can be used as the reference data packet.

At step S1620, the mask packet is obtained. As indicated above, the mask packet is indicative of which of the bits (e.g., bit positions) in the data packet are predictable and which of the bits (e.g., bit positions) in the data packet are not predictable. Typically, the mask packet is a bit map having the same length (in terms of bits) as the data packet. Typically, the mask packet that is obtained at this step is the mask packet at the end of decoding the preceding data packet. However, any mask packet at the end of decoding a previous data packet (within the bounds set by the protection level; i.e., up to a predetermined number of data packets earlier than the current data packet) may be used at this point.

At step S1630, the change history data (e.g., mask evolution history) is extracted from the current encoded data packet. The change history data is indicative of previously changed bits (e.g., previous changes, previously updated bits) of the mask packet. As indicated above, the change history data may comprise one of more indications of changed bits between a respective mask packet and a respective updated mask packet. Each indication of a changed bit may include an indication of a bit position of the changed bit within the respective mask packet, and an indication of a change type of the change. Each indication of a changed bit may further include an indication of an ordering (e.g., time ordering) of the one or more indications of changed bits in the change history data. This indication may correspond to an indication of a previous data packet (e.g., previous cycle) for which this changed bit has been changed (e.g., an indication of how many cycles earlier the respective bit in the mask packet has been changed). The change history data may reach back up to a configurable number of data packets, which number is referred to as the protection level. Thus, the change history data includes all changes that need to be performed on a mask packet for a data packet that precedes the current data packet by the configurable number of data packets in order to arrive at the mask packet for the current data packet. The change history data is described in more detail with reference to FIG. 3 above.

At step S1640, the values of the unpredictable bits of the corresponding decoded data packet are extracted from the encoded data packet. This may yield an array of unpredictable bits. The number of unpredictable bits is identical to the number of bit positions in the mask packet that indicate corresponding bits in the data packet to be not predictable.

At step S1650, an updated mask packet is determined based on the mask packet obtained at step S1620 and the change history data. This may involve applying all changed bits indicated by the change history data to the mask packet obtained at step S1620. Notably, the updated mask packet is identical to the updated mask packet that has been used for encoding the current data packet at the encoding side.

Thus, while the state of the art uses a static mask packet that is either loaded from the ground or periodically generated on-board, the method according to the present disclosure updates the mask packet every time a new data packet is decoded (i.e., in each cycle).

At step S1660, the corresponding decoded data packet is determined (e.g., generated) based on the reference data packet, the updated mask packet, and the values of the unpredictable bits. To this end, the decoded data packet is initialized to the reference data packet, and the values of the unpredictable bits are inserted (in their order in the array of unpredictable bits) at respective bit positions indicated by the updated mask packet (i.e., at bit positions for which the updated mask packet indicates that the respective bit is not predictable). The decoded data packet may be output, for example for transmission or storage.

As indicated above, steps that do not require each other as prerequisites may be performed in any order and may also be performed in parallel. For example, steps S1610, S1620, S1630, and S1640 may be performed in any order or in parallel.

Figure 17:
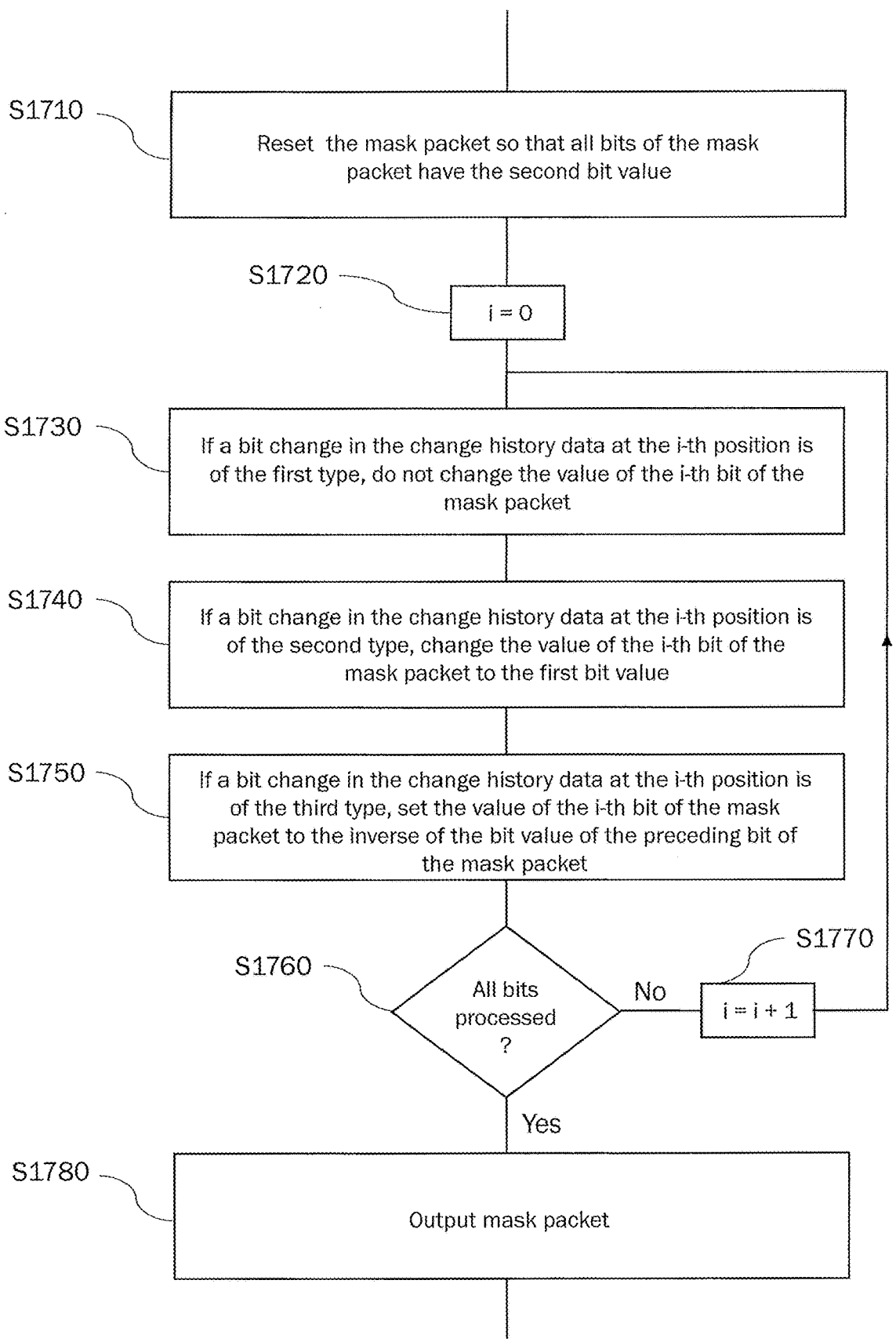
FIG. 17 is a flow chart schematically illustrating additional steps for decoding a packet containing anchor information, and FIG. 18 schematically illustrates an apparatus for encoding (e.g., compressing) or decoding (e.g., decompressing) time series data according to embodiments of the disclosure.

FIG. 17 is a flow chart schematically illustrating additional steps of the method of FIG. 16, for decoding a packet containing anchor information. The steps of FIG. 17 relate to obtaining the updated mask packet from the self-sufficient representation. As indicated above, a packet containing anchor information is an (encoded) data packet that includes a self-sufficient representation of the (updated) mask packet. For a packet containing anchor information, the change history data indicates for each bit change a bit position of the changed bit and a change type, wherein the change types include a first type (e.g., positive change) indicating a bit change of the respective bit from a first bit value that indicates the corresponding bit as not predictable to a second bit value that indicates the corresponding bit as predictable, a second type (e.g., negative change) indicating a bit change of the respective bit from the second bit value to the first bit value, and a third type (e.g., anchor) indicating that the respective bit change relates to the self-sufficient representation of the updated mask packet.

At step S1710, the mask packet is reset so that all bits of the mask packet have the second bit value (e.g., bit value '0', and in general the bit value indicating predictable bits).

Then, the process cycles through the bits of the mask packet and performs the steps described below for each bit of the mask packet. To this end, a counter i is first initialized (e.g., to 0, or alternatively 1, depending on the numbering of bits in the mask packet) at step S1720.

At step S1730, if a bit change in the change history data at a bit position corresponding to the respective bit of the mask packet is of the first type (positive change), the value of the respective bit in the mask packet is not changed (i.e., the value remains at the value to which it has been initialized at step S1710, e.g., bit value '0').

At step S1740, if a bit change in the change history data at a bit position corresponding to the respective bit of the mask packet is of the second type (negative change), the value of the respective bit of the mask packet is changed to the first bit value (i.e., to the value indicating that the corresponding bit in the data packet is not predictable, e.g., bit value '1').

At step S1750, if a bit change in the change history data at a bit position corresponding to the respective bit of the mask packet is of the third type (anchor), the value of the respective bit is set to the inverse of the bit value of the preceding bit of the mask packet. As indicated above, the preceding bit for the first bit (i=0) of the mask packet is assumed to have the second bit value (e.g., bit value '1').

At step S1760, it is checked whether all bits of the mask packet have been processed. To this end, it can be checked whether the counter i has reached its maximum number (e.g., packet length −1, if i is initialized to zero at step S1720, or the packet length itself, if i is initialized to 1).

If unprocessed bits remain (No at step S1760), the counter i is incremented by one at step S1770, and the process returns to step S1730.

Otherwise (Yes at step S1760), the process proceeds to step S1780, at which the reconstructed mask packet is output for being used in the decoding of the encoded data packet.

Next, a process for starting (initializing) encoding (e.g., compression) and decoding (e.g., decompression) will be described.

The first data packet is always sent uncompressed (i.e., in the clear). The frame length (data packet length) is derived from this data packet and a corresponding ground mask packet of that length is created full of '0's (i.e., nothing masked, all bits indicated as predictable). The process then continues as normal.

The start sequence on-board (at the encoding side) is as follows. The first data packet is sent uncompressed and stored as reference data packet. Then, the initial mask packet is set up as all '0's (i.e., nothing masked, all bits indicated as predictable). When the second data packet arrives for encoding, the encoding process described above is run.

The start sequence on-ground is as follows. The first data packet arrives in uncompressed form. It is stored as the reference data packet. The frame length (data packet length) is set to the length of the reference data packet. Then, the ground mask is created with the frame length and initialized to all '0's (i.e., nothing masked, all bits indicated as predictable). When the second data packet (an encoded data packet) arrives, the decoding process described above is run.

Next, a process for restarting encoding (e.g., compression) and decoding (e.g., decompression) will be described.

To avoid a complete stop and start, it is possible for the system to run in the background while uncompressed data packets are sent to the ground. Only the mask packet update part of the algorithm needs to run which is computationally very computationally simple. The compression process can then be restarted immediately by sending a packet with anchor information in the case of fixed reference packets or an uncompressed packet and followed by a packet with anchor information in the case of previous reference packet types (e.g., in chain mode). The process then continues as normal. This can also be useful when switching between fixed reference and previous reference packets which require different masks to be evolved and both can run in the background in parallel. The advantage of this system is that it avoids many counters being generated and sent to the ground before the algorithm has adapted to the data. This may be operationally useful for instance at the start of a pass of the spacecraft when returning from uncompressed to compressed mode with little overhead.

Next, modifications and extensions of the above processes will be described.

First, it is to be noted that the update of the mask packet, the update of the change history data, and the generation of the unpredictable bits can proceed independently from each other. As described above, the update of the mask packet is computationally simple. Moreover, the update of the change history data is also very efficient since, once the algorithm is adapted, very few changes can be expected. Therefore, most processing power is in fact required for generating the unpredictable bits.

Since the evolution of the mask packet and update of the mask history is computationally inexpensive compared to the generation of the unpredictable bits, the mask packet and change history data could be configured to keep track of a very large number of parameters of the monitored system, while only a subset of this very large number of parameters is eligible for transmission as unpredictable bits. That is, the data packets, reference data packets, mask packets, etc., could have a given length, i.e., span a given number of parameters (e.g., a very large number of parameters). The change history data could be updated accordingly and could be communicated to the decompression side as indicated above. Since the change history data can be represented in very compact form (by using count arrays), bandwidth consumption for communicating the change history data to the decompression side is manageable. Then, in order to conserve bandwidth and processing resources, only a limited subset of these parameters (and correspondingly, a limited subset of bits in the data packets) could be classified as bits for which unpredictable bits would be included in the encoded data packet (provided that the algorithm has classed them as unpredictable). Thereby, information on a much larger number of bits can be inferred by the decompression algorithm (i.e., all those bits classed as predictable for the large set) without having to spend significant bandwidth or processing power on sending all the corresponding non predictable bits in that set. Only those non predictable bits designated as essential would be sent. This would enable the ground to establish value ranges for many more parameters or simply establish that most of the parameters had not changed for almost zero processing power or bandwidth overhead. Note that in order for this to work the algorithm has to be slightly updated to send absolute bit value for any parameters classed as predictable again after being classed as unpredictable, i.e. by a positive update.

Figure 18:
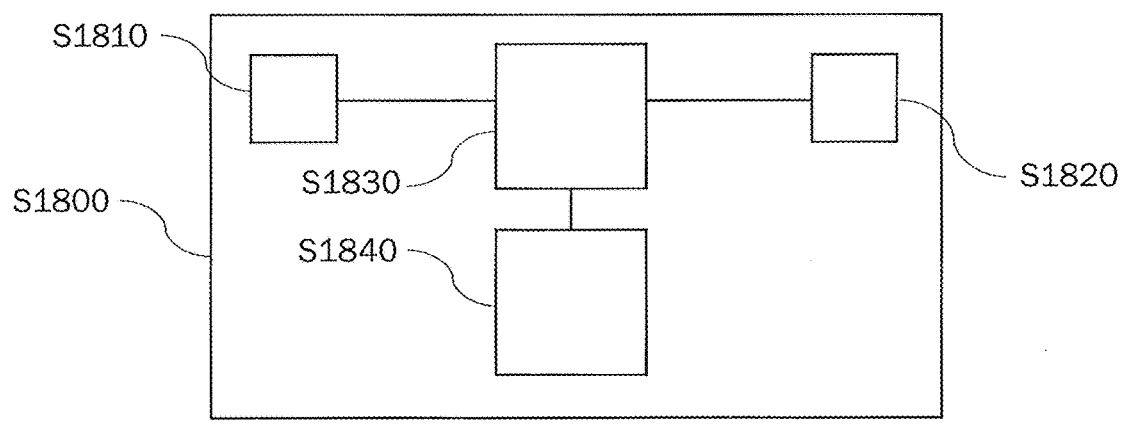

FIG. 18 schematically illustrates an apparatus 1800 for encoding or decoding data packets. The apparatus 1800 comprises a receiving unit (receiver; or input unit) 1810 for receiving the data packets to be encoded or decoded, and an output unit 1820 for outputting the encoded or decoded data packets. The apparatus further comprises a processor 1830 coupled to a memory 1840. The processor 1830 may carry out instructions stored in the memory 1840 and, doing so, may encode or decode the data packets in accordance with any of the processes described above. To this end, the processor may be connected to both the receiving unit 1810 and the output unit 1820.

Next, advantages of the method according to the present disclosure will be summarized.

Reactivity

The system immediately reacts to negative changes in individual bit behavior. A wrong prediction for a predictable bit will result in that bit being masked from the very next packet on. It will only be classed as predictable again once such behavior is confirmed. This feature allows the algorithm to deal more effectively with more types of data, such as data where the bits exhibit both stable and not stable behavior over short timescales. Effectively, the algorithm constantly tracks the data redundancy in the packets at bit level and reacts conservatively making it safe to use in any situation. This fast reaction also reduces CPU usage and increases speed—since creating wrong counters is the most processor-intensive part of the algorithm.

Robustness

Changing the paradigm to evolving the mask rather than reference data packet has allowed two different and complimentary types of protection system to be introduced: Anchor information and packet loss protection. This means the system is now very robust. The system can be made insensitive to multiple sequential packet losses in both directions. The decompression algorithm can decompress packets forward and backwards in time starting from any packet containing anchor information. Packets containing anchor information can be decompressed without prior mask information and with a wide variety of reference data packets including other packets containing anchor information.

This means all the advantages of the old POCKET chain mode can be enjoyed (innate stability, better performance) while the system remains robust.

Simpler Ground Software

There is now very limited ground software required. Mask packets and reference data packets are no longer required to be calculated and loaded from the ground. This eliminates the need to access the telemetry history files and make statistical analysis on the ground.

Decompression is Compression Configuration Agnostic

There is no need for ensuring external synchronization of the compression module on-board and the decompression module. This implies that the compression algorithm can act completely independently of the decompression algorithm (e.g., the compression algorithm can change the configuration in reaction to compression performance or on-board events). It also means the operator can command the algorithm directly in the same way without having to worry about changing the configuration on the ground. It also implies that the decompression software requires no set-up or configuration—it now knows how to decompress any compressed packet without any a-priori information. This is much safer, robust and has a lower impact on operations.

No Separate Packets

There are no separate packets to send. If 100 data packets for encoding are generated, then 100 packets are sent no matter how the system is configured. This reduces complexity and overhead. Some information which was sent in separate packets once in the state of the art solution, e.g. new mask update, is now sent as part of the mask evolution history and is sent multiple times depending on the protection level.

Increased Information Density, can Retrieve Lost Information

The system can retrieve data in "lost" data packets. Sending the mask evolution history between different data packets results in each individual data packet containing substantially more information than before. Each data packet contains its own information but now also the vast majority of the information from the data packets used to create mask evolution history. In simple terms, if one decompresses a data packet using a data packet in the past (n-x) data packets, then it is known that all the bits classed as predictable in that present data packet had the same state in all the intermediate data packets, i.e., from n−x to n−1. We also know that in data packet n−1 all the predictable bits had the same state as in the present data packet except those that are in the present run counter which had the opposite state. We also know that if a bit is in the history as having been masked but is the same state now as before it changed state twice.

This simple idea means that implementing this invention allows to recover the majority of the information in the lost data packets. For example, consider the case that we implemented the system so that four sequential data packets could be lost without breaking the chain. In the traditional case, this would mean the information in those four lost data packets would be lost forever. Employing the method according to the present disclosure, one can recover a lot of that information. At a bit level this is equal to the information being carried in the predictable bits counters of the four intermediate data packets as well as the data packet itself.

Easily Configurable

The system can be easily changed to adjust how robust and adaptive it is. One can insert anchor information more or less frequently, make positive updates more or less frequently, and adjust the level of the packet loss protection. This configuration is totally independent from the decompression algorithm and so can be done autonomously on-board or by an operator by command at any time.

Simple Ground Space Interface

The ground-onboard interface is much simpler. Configuration includes now only: ON; OFF; set the frequency of the positive mask update; set the frequency of the anchor information; select the packet type (fixed or previous reference); and set the level of packet loss protection. This could be combined into a single command to set the compression configuration for that particular data packet type. A command to request a reference data packet update is required for the fixed reference packet option.

Good Performance with Low Overheads

The overhead is small to implement a high level of robustness, see results.

Fast Enough to Use on the Real-Time Data Stream

The compression and decompression system relies almost entirely on bitwise operations. These are fast, simple actions directly supported by the processor and so the whole process runs extremely quickly, in fact fast enough for this to be injected into a typical real-time spacecraft housekeeping telemetry stream without time delays being noticeable.

In the above, terms such as receiving side, decoding side, decompressing side, ground, etc. have been used synonymously. Moreover, also terms such as transmitting side, encoding side, compressing side, on-board, etc. have been used synonymously.

Moreover, while reference is frequently made to spacecraft and satellites, the present disclosure can be applied to any kind of system that produces time series data, and is not limited in its applicability to spacecraft and satellites.

It should also be noted that the method features described above correspond to respective apparatus and system features that may not be explicitly described, for reasons of conciseness, and vice versa. The disclosure of the present document is considered to extend also to such apparatus and system features, and vice versa.

It should further be noted that the description and drawings merely illustrate the principles of the proposed method and system. Those skilled in the art will be able to implement various arrangements that, although not explicitly described or shown herein, embody the principles of the invention and are included within its spirit and scope.

Furthermore, all examples and embodiment outlined in the present document are principally intended expressly to be only for explanatory purposes to help the reader in understanding the principles of the proposed method and system. Furthermore, all statements herein providing principles, aspects, and embodiments of the invention, as well as specific examples thereof, are intended to encompass equivalents thereof.

The invention claimed is:

1. A method of encoding time series data, the method comprising:
   receiving a plurality of data packets of time series data; and
   sequentially encoding the plurality of data packets,
   wherein sequentially encoding the plurality of data packets comprises, for a data packet among the plurality of data packets:
      obtaining a reference data packet for the data packet;
      obtaining a mask packet indicative of which of the bits in the data packet are predictable and which of the bits in the data packet are not predictable;
      obtaining change history data indicative of previously changed bits of the mask packet;
      determining an updated mask packet based on the mask packet, the data packet, and the reference data packet;
      determining updated change history data based on the change history data, the mask packet, and the updated mask packet;
      determining, as unpredictable bits, all those bits of the data packet that are indicated as not predictable by the updated mask packet; and
      generating an encoded data packet including a representation of the updated change history data and a representation of values of the unpredictable bits of the data packet.

2. The method according to claim 1, wherein determining the updated mask packet comprises:
   comparing the data packet to the reference data packet.

3. The method according to claim 2, wherein determining the updated mask packet further comprises:
   configuring the updated mask packet to indicate all those bits as not predictable that are indicated as not predictable in the mask packet, or that are different between the data packet and the reference data packet.

4. The method according to claim 1, wherein determining the updated change history data comprises:
   comparing the updated mask packet to the mask packet; and
   adding an indication of changed bits between the updated mask packet and the mask packet to the change history data.

5. The method according to claim 1, wherein the change history data comprises:
   one of more indications of changed bits between a respective mask packet and a respective updated mask packet,
   wherein each indication of a changed bit includes an indication of a bit position of the changed bit within the respective mask packet, and an indication of a change type of the change.

6. The method according to claim 1,
   wherein the mask packet that is obtained for the data packet is the updated mask packet of the data packet preceding the data packet.

7. The method according to claim 1,
wherein the reference data packet that is obtained for the data packet is the data packet preceding the data packet, or a predetermined reference data packet.

8. The method according to claim 1,
wherein the change history data that is obtained for the data packet is the updated change history data of the data packet preceding the data packet.

9. The method according to claim 1, further comprising:
monitoring values of bits in a sequence of data packets among the plurality of data packets;
if the value of the bit at a given bit position in the sequence of data packets does not change for a given number of sequential data packets, judging the given bit position to relate to a bit that is predictable, and otherwise judging the given bit position to relate to a bit that is not predictable; and
after the given number of data packets have been sequentially encoded:
updating the mask packet based on a result of the judgement; and
updating the change history data based on the result of the judgement.

10. The method according to claim 1, further comprising, if the data packet is to be additionally encoded to include a self-sufficient representation of the updated mask packet:
obtaining a horizontal XOR of the updated mask packet;
run-length encoding the horizontal XOR of the updated mask packet;
determining second updated change history data based on the updated change history data and the run-length-encoded horizontal XOR of the updated mask packet;
generating the encoded data packet to include a representation of the second updated change history data and the representation of values of the unpredictable bits of the data packet; and
setting a bit flag in the encoded data packet to indicate that the encoded data packet includes the self-sufficient representation of the updated mask packet.

11. A method of decoding time series data, for decoding a plurality of encoded data packets of time series data into corresponding decoded data packets of time series data, each encoded data packet including a representation of change history data and a representation of values of unpredictable bits of the corresponding decoded data packet, wherein the change history data is indicative of previously changed bits of a mask packet, and wherein the mask packet is indicative of which of the bits in the corresponding decoded data packet are predictable and which of the bits in the corresponding decoded data packet are not predictable, the method comprising:
receiving the plurality of encoded data packets of time series data; and
sequentially decoding the plurality of encoded data packets,
wherein sequentially decoding the plurality of encoded data packets comprises, for an encoded data packet among the plurality of encoded data packets:
obtaining a reference data packet for the corresponding decoded data packet;
obtaining the mask packet;
extracting the change history data from the encoded data packet;
extracting the values of the unpredictable bits of the corresponding decoded data packet from the encoded data packet;
determining an updated mask packet based on the mask packet and the change history data;
determining the corresponding decoded data packet based on the reference data packet, the updated mask packet, and the values of the unpredictable bits.

12. The method according to claim 11, wherein the change history data extracted from the encoded data packet comprises:
one of more indications of changed bits between a respective mask packet and a respective updated mask packet,
wherein each indication of a changed bit includes an indication of a bit position of the changed bit within the respective mask packet, and an indication of a change type of the change.

13. The method according to claim 11, wherein determining the updated mask packet comprises:
applying all changed bits indicated by the change history data to the mask packet.

14. The method according to claim 11,
wherein the mask packet that is obtained for the encoded data packet is based on an updated mask packet of an encoded data packet that has been decoded earlier.

15. The method according to claim 11,
wherein the reference data packet that is obtained for the corresponding decoded data packet is the corresponding decoded data packet decoded from an encoded data packet that has been decoded earlier, or a predetermined reference data packet.

16. The method according to claim 11, further comprising, if the encoded data packet is flagged to include a self-sufficient representation of the updated mask packet, in which case the change history data indicates for each bit change a bit position of the changed bit and a change type, the change types including a first type indicating a bit change of the respective bit from a first bit value that indicates the corresponding bit as not predictable to a second bit value that indicates the corresponding bit as predictable, a second type indicating a bit change of the respective bit from the second bit value to the first bit value, and a third type indicating that the respective bit change relates to the self-sufficient representation of the updated mask packet, obtaining the updated mask packet by:
resetting the mask packet so that all bits of the mask packet have the second bit value; and
cycling through the bits of the mask packet and for each bit of the mask packet:
if a bit change in the change history data at a bit position corresponding to the respective bit of the mask packet is of the first type, not changing the value of the respective bit;
if a bit change in the change history data at a bit position corresponding to the respective bit of the mask packet is of the second type, changing the value of the respective bit to the first bit value; and
if a bit change in the change history data at a bit position corresponding to the respective bit of the mask packet is of the third type, setting the value of the respective bit to the inverse of the bit value of the preceding bit of the mask packet, wherein the preceding bit for the first bit of the mask packet is assumed to have the second bit value.

\* \* \* \* \*